United States Patent
Basrur et al.

(10) Patent No.: US 12,520,591 B2
(45) Date of Patent: Jan. 6, 2026

(54) DISPLAY DEVICE AND MANUFACTURING METHOD FOR DISPLAY DEVICE

(71) Applicant: Samsung Display Co., LTD., Yongin-si (KR)

(72) Inventors: Veidhes Basrur, Yongin-si (KR); Ock Soo Son, Yongin-si (KR); Ki Nyeng Kang, Yongin-si (KR); Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 612 days.

(21) Appl. No.: 17/945,186

(22) Filed: Sep. 15, 2022

(65) Prior Publication Data

US 2023/0290790 A1    Sep. 14, 2023

(30) Foreign Application Priority Data

Mar. 14, 2022   (KR) ........................ 10-2022-0031470

(51) Int. Cl.
| | |
|---|---|
| *H10D 86/60* | (2025.01) |
| *H01L 25/16* | (2023.01) |
| *H10D 86/01* | (2025.01) |
| *H10D 86/40* | (2025.01) |
| *H10H 20/01* | (2025.01) |
| *H10H 20/831* | (2025.01) |
| *G09G 3/32* | (2016.01) |

(52) U.S. Cl.
CPC .......... *H10D 86/60* (2025.01); *H01L 25/167* (2013.01); *H10D 86/0231* (2025.01); *H10D 86/451* (2025.01); *H10H 20/831* (2025.01); *G09G 3/32* (2013.01); *G09G 2300/0426* (2013.01); *G09G 2300/0819* (2013.01); *G09G 2300/0842* (2013.01); *H10H 20/032* (2025.01)

(58) Field of Classification Search
None
See application file for complete search history.

(56) References Cited

U.S. PATENT DOCUMENTS

| | | | |
|---|---|---|---|
| 9,023,164 B2 | 5/2015 | Sung et al. | |
| 9,478,586 B2 | 10/2016 | Lee | |
| 2013/0329155 A1 | 12/2013 | Kwak et al. | |
| 2020/0258938 A1* | 8/2020 | Chai | H10H 29/39 |
| 2023/0389369 A1* | 11/2023 | Ushikubo | H05B 33/10 |

FOREIGN PATENT DOCUMENTS

| | | |
|---|---|---|
| KR | 10-2013-0142784 | 12/2013 |
| KR | 10-2020-0121956 | 10/2020 |

* cited by examiner

*Primary Examiner* — Bo B Jang
(74) *Attorney, Agent, or Firm* — Womble Bond Dickinson (US) LLP

(57) ABSTRACT

A display device includes pixels. Each of the pixels includes electrodes disposed on a base layer; a first insulating layer disposed on the electrodes; a light emitting element disposed on the first insulating layer; a bank disposed on the first insulating layer and protruding in a thickness direction of the base layer; and a second insulating layer, at least a portion of the second insulating layer being disposed on the first insulating layer. At least part of the electrodes of a pixel among the pixels are spaced apart from at least part of the electrodes of another pixel adjacent to the pixel with an open area being disposed between the electrodes. The first insulating layer includes a first opening overlapping the open area in a plan view, and the second insulating layer includes a second opening overlapping the open area in a plan view.

11 Claims, 21 Drawing Sheets

DISPLAY DEVICE AND MANUFACTURING METHOD FOR DISPLAY DEVICE

CROSS REFERENCE TO RELATED APPLICATION(S)

The application claims priority to and benefits of Korean Patent Application No. 10-2022-0031470 under 35 U.S.C. § 119, filed on Mar. 14, 2022, in the Korean Intellectual Property Office (KIPO), the entire contents of which are incorporated herein by reference.

BACKGROUND

1. Technical Field

The disclosure generally relates to a display device and a manufacturing method for a display device.

2. Description of the Related Art

Recently, as interest in information displays is increased, research and development of display devices have been continuously conducted.

SUMMARY

Embodiments provide a display device and a manufacturing method for a display device, in which the number of required masks is reduced, so that process cost may be saved.

In accordance with an aspect of the disclosure, there is provided a display device including pixels, wherein each of the pixels includes electrodes disposed on a base layer; a first insulating layer disposed on the electrodes; a light emitting element disposed on the first insulating layer; a bank disposed on the first insulating layer and protruding in a thickness direction of the base layer; and a second insulating layer, at least a portion of the second insulating layer being disposed on the first insulating layer, at least part of the electrodes of a pixel among the pixels are spaced apart from at least part of the electrodes of another pixel adjacent to the pixel with an open area being disposed between the electrodes, the first insulating layer includes a first opening overlapping the open area in a plan view, the second insulating layer includes a second opening overlapping the open area in a plan view, and the second opening entirely overlaps the first opening in a plan view.

The light emitting element may be disposed in an area surrounded by the bank in a plan view.

Another portion of the second insulating layer may be disposed on the bank, and another portion of the second insulating layer may be disposed on the light emitting element.

The second opening may expose at least a portion of each of the first insulating layer and the electrodes.

The first opening may overlap top surfaces of the electrodes, and expose side surfaces of the electrodes in a plan view.

The second opening may entirely overlap the first opening in a plan view.

The first opening may have a first width, and the second opening may have a second width. The second width may be greater than the first width.

The open area may have an open width. The second width may be greater than the open width.

The first width may be greater than the open width.

Each of the pixels may further include a first connection electrode supplying an anode signal for the light emitting element to emit light. The electrodes may include a first electrode electrically connected to the first connection electrode. The first electrode of one pixel among the pixels may be spaced apart from the first electrode of another pixel adjacent to the pixel with the open area being disposed between the electrodes.

Each of the pixels may include connection electrodes electrically connected to the light emitting element. The connection electrodes may include a first connection electrode, a second connection electrode, a third connection electrode, a fourth connection electrode, and a fifth connection electrode. The light emitting element may include a first light emitting element, a second light emitting element, a third light emitting element, and a fourth light emitting element. The first light emitting element may be electrically connected between the first connection electrode and the second connection electrode, the second light emitting element may be electrically connected between the second connection electrode and the third connection electrode, the third light emitting element may be electrically connected between the third connection electrode and the fourth connection electrode, and the fourth light emitting element may be electrically connected between the fourth connection electrode and the fifth connection electrode.

In accordance with an aspect of the disclosure, there is provided a method for manufacturing a display device including disposing electrodes on a base layer; disposing a first insulating layer on the electrodes; forming a residual bank pattern and a bank on the first insulating layer; disposing a light emitting element on the first insulating layer; disposing a base insulating layer on the light emitting element; providing a second insulating layer by patterning a photoresist layer on the base insulating layer and removing at least a portion of the base insulating layer, using the patterned photoresist layer; removing the residual bank pattern; and removing portions of the electrodes by using the patterned photoresist layer.

The forming of the residual bank pattern and the bank may include disposing the bank on the first insulating layer; and forming the residual bank pattern in a first opening formed by the first insulating layer.

The residual bank pattern may have a shape corresponding to a shape of the first opening.

The forming of the residual bank pattern and the bank may include forming a base bank layer and patterning the base bank layer by using a mask including a full-tone area and a half-tone area.

The forming of the residual bank pattern and the bank may include forming the residual bank pattern to contact the electrodes.

The removing of the portions of the electrodes may include etching portions of the electrodes without further forming a separate etching mask after the removing of the residual bank pattern.

The disposing of the base insulating layer may include disposing the base insulating layer to contact the residual bank pattern such that the electrodes are not exposed.

The disposing of the light emitting element may include providing ink including the light emitting element onto the first insulating layer; supplying an alignment signal to the electrodes; and aligning the light emitting element on the first insulating layer, based on an electric field according to the alignment signal.

The etching of the portions of the electrodes may include forming an open area having a width corresponding to a width of a first opening formed in the first insulating layer by performing an etching process using the patterned photoresist layer as an etching mask. A width of a second opening formed in the second insulating layer may be greater than the width of the first opening.

BRIEF DESCRIPTION OF THE DRAWINGS

Example embodiments will now be described more fully hereinafter with reference to accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawings, dimensions may be exaggerated for clarity of illustration. It will be understood that in case that an element is referred to as being "between" two elements, it may be the only element between the two elements, or one or more intervening elements may also be present. Like reference numerals refer to like elements throughout.

DETAILED DESCRIPTION OF THE EMBODIMENTS

Figure 1:
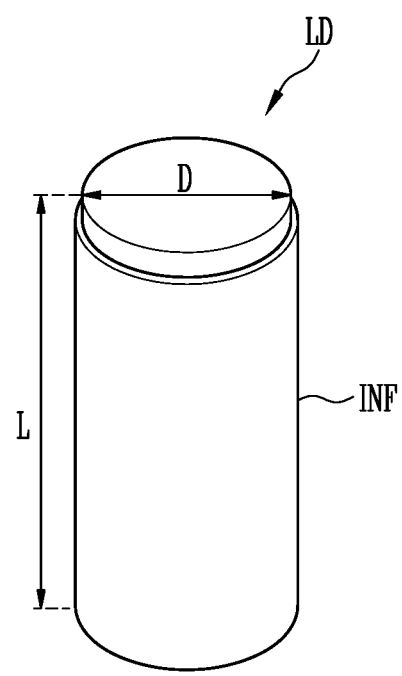
FIG. 1 is a schematic perspective view illustrating a light emitting element in accordance with an embodiment of the disclosure.

The disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Unless otherwise specified, the illustrated embodiments are to be understood as providing example features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only an embodiment where the element is placed "directly on" or "just above" the other element but also an embodiment where a further element is interposed between the element and the other element. On the contrary, an expression that an element such as a layer, region, substrate or plate is placed "beneath" or "below" another element indicates not only an embodiment where the element is placed "directly beneath" or "just below" the other element but also an embodiment where a further element is interposed between the element and the other element.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The disclosure generally relates to a display device and a manufacturing method for a display device. Hereinafter, a display device and a manufacturing method for a display device in accordance with an embodiment of the disclosure will be described with reference to the accompanying drawings.

Figure 2:
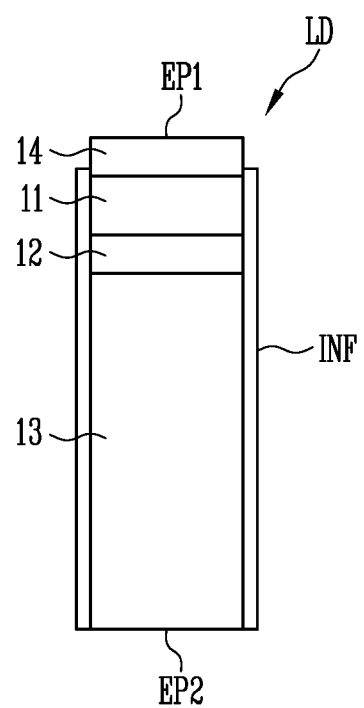
FIG. 2 is a schematic sectional view illustrating the light emitting element in accordance with an embodiment of the disclosure.

FIG. 1 is a schematic perspective view illustrating a light emitting element in accordance with an embodiment of the disclosure. FIG. 2 is a schematic sectional view (or cross-sectional view) illustrating the light emitting element in accordance with the embodiment of the disclosure. Although a pillar-shaped light emitting element LD is illustrated in FIGS. 1 and 2, a kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In an embodiment, the light emitting element LD may be a light emitting element manufactured in a pillar shape through an etching process, or the like. In this specification, a term "pillar shape" may include a rod-like shape or bar-like shape, of which aspect ratio is greater than about 1, such as a cylinder or a polyprism, and the shape of its section is not limited.

The light emitting element LD may have a size small to a degree of nanometer scale to micrometer scale. For example, the light emitting element LD may have a diameter D (or width) in a range of the nanometer scale to micrometer scale and/or a length L in a range of the nanometer scale to micrometer scale. However, the size of the light emitting element LD is not limited thereto, and the size of the light emitting element LD may be variously changed according to design conditions of various types of devices (e.g., a display device), and the like, which use, as a light source, a light emitting device using the light emitting element LD.

The first semiconductor layer 11 may be a first conductivity type semiconductor layer. For example, the first semiconductor layer 11 may include a p-type semiconductor layer. For example, the first semiconductor layer 11 may include at least one semiconductor material among InAlGaN, GaN, AlGaN, InGaN, AlN, and InN, or any combination thereof, and may include a p-type semiconductor layer doped with a first conductivity type dopant such as Mg. However, the at least one semiconductor material constituting the first semiconductor layer 11 is not limited thereto. The first semiconductor layer 11 may be configured with various materials.

The active layer 12 may be disposed between the first semiconductor layer 11 and the second semiconductor layer 13. The active layer 12 may include any of a single well structure, a multi-well structure, a single quantum well structure, a multi-quantum well (MQW) structure, a quantum dot structure, and a quantum wire structure, but the disclosure is not limited thereto. The active layer 12 may include GaN, InGaN, InAlGaN, AlGaN, AlN, or the like. The active layer 12 may configured with various materials.

In case that a voltage which is a threshold voltage or more is applied to ends of the light emitting element LD, the light emitting element LD may emit light as electron-hole pairs are combined in the active layer 12. The light emission of the light emitting element LD may be controlled by using such a principle, so that the light emitting element LD may be used as a light source for various light emitting devices, including a pixel of a display device.

The second semiconductor layer 13 may be formed on the active layer 12, and may include a semiconductor layer having a type different from that of the first semiconductor layer 11. For example, the second semiconductor layer 13 may include an n-type semiconductor layer. In an embodiment, the second semiconductor layer 13 may include any semiconductor material among InAlGaN, GaN, AlGaN, InGaN, AlN, and InN, and may include an n-type semiconductor layer doped with a second conductivity type dopant such as Si, Ge or Sn. However, the semiconductor material constituting the second semiconductor layer 13 is not limited thereto. The second semiconductor layer 13 may be configured with various materials.

The electrode layer 14 may be disposed on the first end portion EP1 and/or the second end portion EP2 of the light emitting element LD. Although an embodiment where the electrode layer 14 is formed on the first semiconductor layer 11 is described as an example in FIG. 2, the disclosure is not necessarily limited thereto. For example, a separate electrode layer may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), zinc oxide (ZnO), and zinc tin oxide (ZTO), but the disclosure is not necessarily limited thereto. In case that the electrode layer 14 may be made of (or include) the transparent metal or the transparent metal oxide, light generated in the active layer 12 of the light emitting element LD may pass through the electrode layer 14, and may be emitted to an outside of the light emitting element LD.

An insulating film INF may be provided on a surface of the light emitting element LD. The insulating film INF may be disposed (e.g., directly disposed) on surfaces of the first semiconductor layer 11, the active layer 12, the second semiconductor layer 13, and/or the electrode layer 14. The insulating film INF may expose the first and second end portions EP1 and EP2 of the light emitting element LD, which have different polarities. In an embodiment, the insulating film INF may expose a side portion of the electrode layer 14 and/or the second semiconductor layer 13, adjacent to the first and second end portions EP1 and EP2 of the light emitting element LD.

The insulating film INF may prevent an electrical short circuit which may occur in case that the active layer 12 contacts a conductive material except the first and second semiconductor layers 11 and 13. Also, the insulating film INF may minimize a surface defect of light emitting elements LD, thereby a lifetime and light emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof. For example, the insulating film INF may be configured as a double layer, and layers constituting the double layer may include different materials. For example, the insulating film INF may be configured as a double layer including aluminum oxide ($AlO_x$) or silicon oxide ($SiO_x$), but the disclosure is not necessarily limited thereto. In an embodiment, the insulating film INF may be omitted.

A light emitting device including the above-described light emitting element LD may be used in various kinds of devices which require a light source, including a display device. For example, light emitting elements LD may be disposed in each pixel of a display panel (provided in the display device), and may be used as a light source of each pixel. However, an application field of the light emitting element LD is not limited to the above-described example. For example, the light emitting element LD may be used in other types of devices that require a light source, such as a lighting device.

Figure 3:
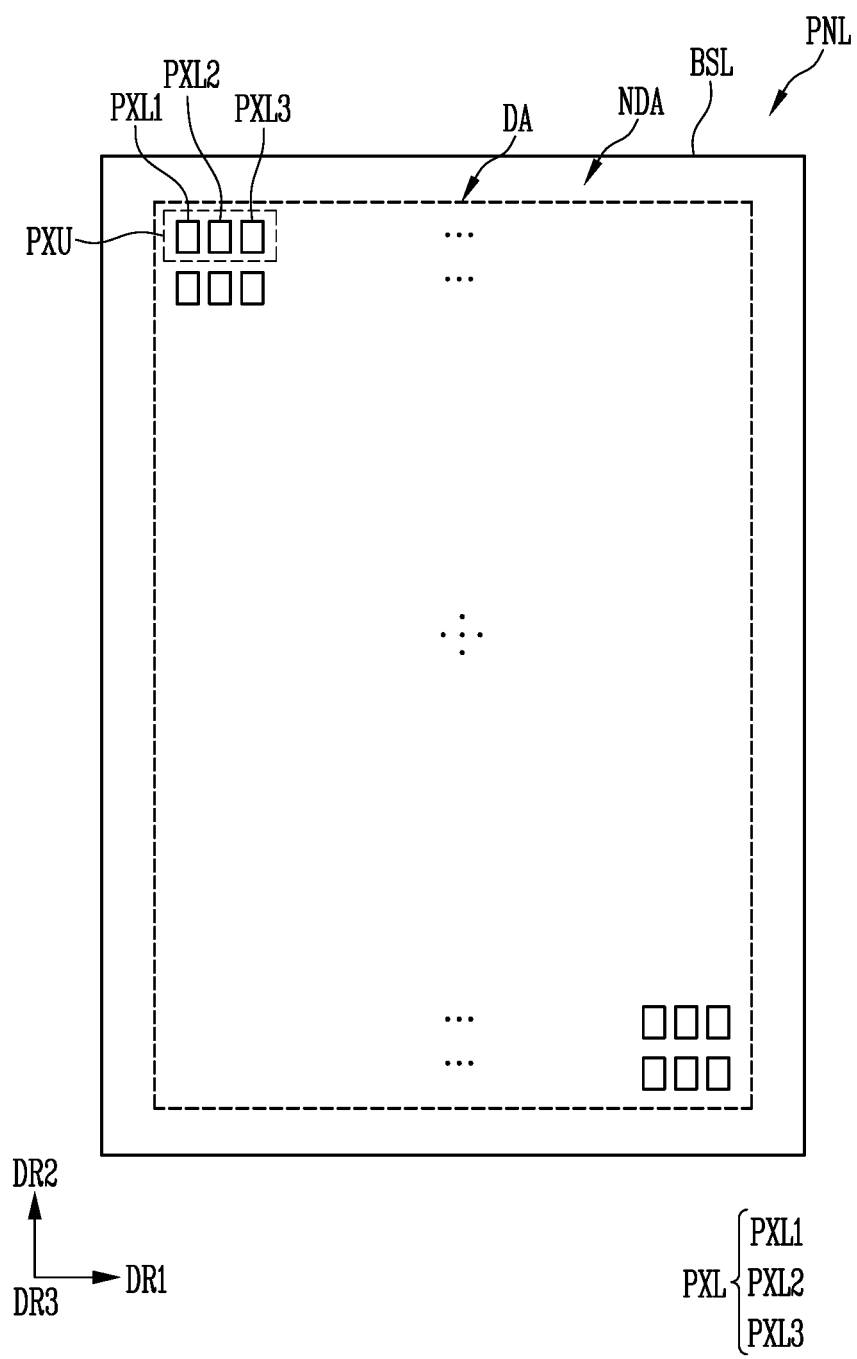
FIG. 3 is a schematic plan view illustrating a display device in accordance with an embodiment of the disclosure.

FIG. 3 is a schematic plan view illustrating a display device in accordance with an embodiment of the disclosure.

In FIG. 3, a display device, particularly, a display panel PNL provided in the display device will be illustrated as an example of an electronic device which may use, as a light source, the light emitting element LD described in the embodiment shown in FIGS. 1 and 2.

For convenience of description, in FIG. 3, a structure of the display panel PNL will be briefly illustrated based on a display area DA. However, in an embodiment, at least one driving circuit (e.g., at least one of a scan driver and a data driver), lines, and/or pads, which are not shown in the drawing, may be further disposed in the display panel PNL.

Referring to FIG. 3, the display panel PNL and a base layer BSL for forming the display panel PNL may include the display area DA for displaying an image and a non-display area NDA except the display area DA. The display area DA may constitute a screen on which the image is displayed, and the non-display area NDA may be a remaining area except the display area DA.

A pixel unit PXU may be disposed in the display area DA. The pixel unit PXU may include a first pixel PXL1, a second pixel PXL2, and/or a third pixel PXL3. Hereinafter, in case that at least one pixel among the first pixel PXL1, the second pixel PXL2, and the third pixel PXL3 is arbitrarily designated, or in case that two or more kinds of pixels of the first pixel PXL1, the second pixel PXL2, and the third pixel PXL3 are inclusively designated, the corresponding pixel or the corresponding pixels will be referred to as a "pixel PXL" or "pixels PXL."

The pixels PXL may be regularly arranged according to a stripe structure, a PENTILE™ structure, or the like. However, an arrangement structure of the pixels PXL is not limited thereto, and the pixels PXL may be arranged in the display area DA by using various structures and/or methods.

In an embodiment, two or more kinds of pixels PXL emitting lights of different colors may be disposed in the display area DA. For example, first pixels PXL1 emitting light of a first color, second pixels PXL2 emitting light of a second color, and third pixels PXL3 emitting light of a third color may be arranged in the display area DA. At least one first pixel PXL1, a least one second pixel PXL2, and at least one third pixel PXL3, which are disposed adjacent to each other, may constitute the pixel unit PXU capable of emitting lights of various colors. For example, each of the first to third pixels PXL1, PXL2, and PXL3 may be a pixel emitting light of color (e.g., a predetermined or selectable color). In an embodiment, the first pixel PXL1 may be a red pixel emitting light of red, the second pixel PXL2 may be a green pixel emitting light of green, and the third pixel PXL3 may be a blue pixel emitting light of blue. However, the disclosure is not limited thereto.

In an embodiment, the first pixel PXL1, the second pixel PXL2, and the third pixel PXL3 may have light emitting elements emitting light of a same color, and may include color conversion layers and/or color filters of different colors, which are disposed on the respective light emitting elements, to emit lights of the first color, the second color, and the third color. In another embodiment, the first pixel PXL1, the second pixel PXL2, and the third pixel PXL3 may have, as light sources, a light emitting element of the first color, a light emitting element of the second color, and a light emitting element of the third color, so that the light emitting elements may emit lights of the first color, the second color, and the third color. However, a color, a kind, and/or number of pixels PXL constituting each pixel unit PXU are not limited. For example, the color of light emitted by each pixel PXL may be variously changed.

The pixel PXL may include at least one light source driven by a control signal (e.g., a scan signal and a data signal) and/or a power source (e.g., a first power source and a second power source). In an embodiment, the at least one light source may include at least one light emitting element LD in accordance with the embodiment shown in FIGS. 1 and 2, e.g., a subminiature pillar-shaped light emitting element LD having a size small to a degree of nanometer scale to micrometer scale. However, the disclosure is not necessarily limited thereto. Various types of light emitting elements LD may be used as light sources of the pixel PXL.

In an embodiment, each pixel PXL may be configured as an active pixel. However, a kind, structure, and/or driving method of pixels PXL which may be applied to the display device are not limited. For example, each pixel PXL may be configured as a pixel of a passive or active light emitting display device using various structures and/or driving methods.

Figure 4:
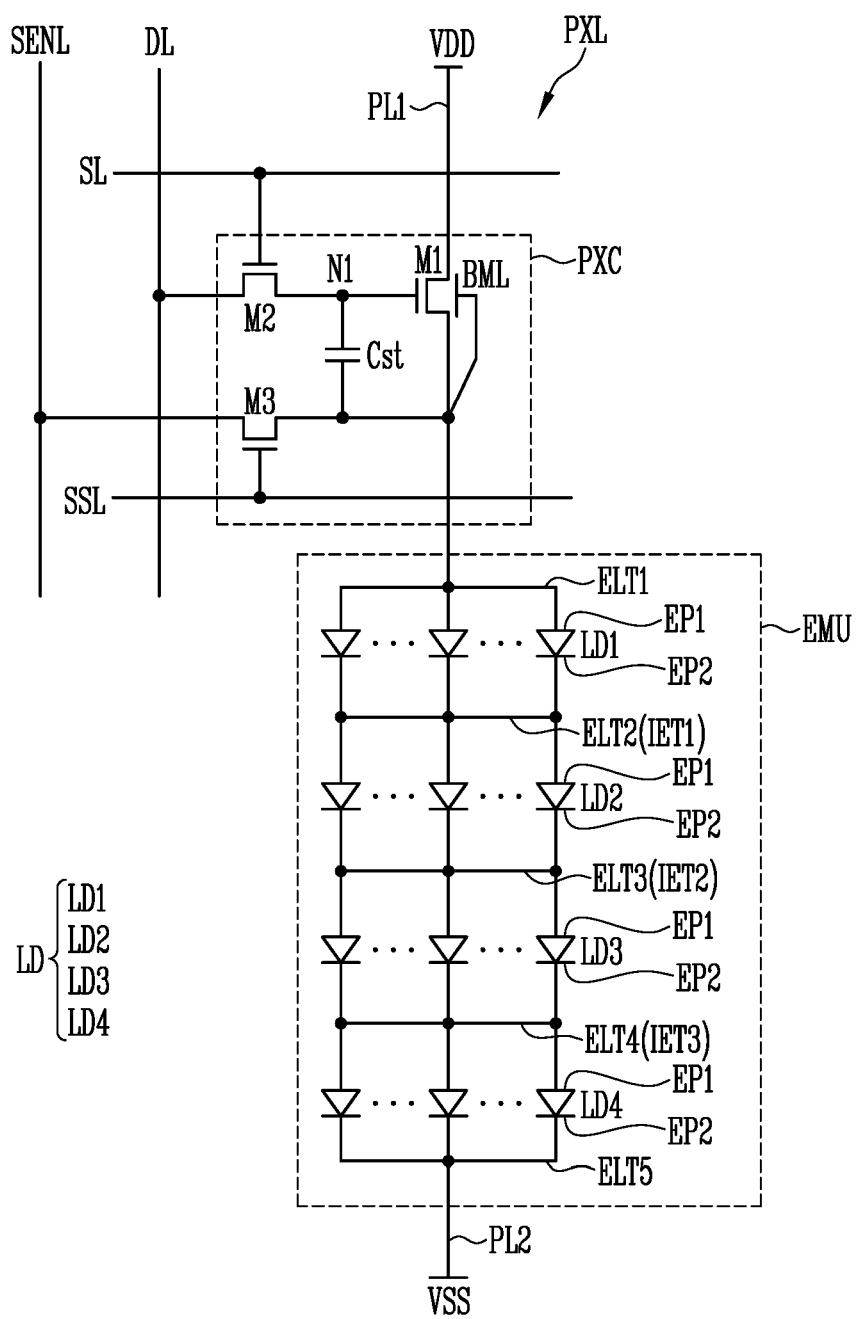
FIG. 4 is a schematic diagram of an equivalent circuit illustrating a pixel in accordance with an embodiment of the disclosure.

FIG. 4 is a schematic diagram of equivalent circuit illustrating a pixel in accordance with an embodiment of the disclosure.

In an embodiment, a pixel PXL shown in FIG. 4 may be any of the first pixel PXL1, the second pixel PXL2, and the third pixel PXL3, which are provided in the display panel PNL shown in FIG. 3. The first pixel PXL1, the second pixel PXL2, and the third pixel PXL3 may have structures substantially identical or similar to one another.

Referring to FIG. 4, the pixel PXL may include a light emitting unit EMU for generating light with a luminance corresponding to a data signal and a pixel circuit PXC for driving the light emitting unit EMU.

The pixel circuit PXC may be connected between a first power source VDD and the light emitting unit EMU. Also, the pixel circuit PXC may be connected to a scan line SL and a data line DL of the corresponding pixel PXL, to control an operation of the light emitting unit EMU, corresponding to a scan signal and the data signal, which are supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connection electrode ELT1. A gate electrode of the first transistor M1 may be connected to a first node N1. The first transistor M1 may control a driving current supplied to the light emitting unit EMU, corresponding to a voltage of the first node N1. For example, the first transistor M1 may be a driving transistor for controlling a driving current of the pixel PXL.

In an embodiment, the first transistor M1 may selectively include a lower conductive layer BML (also referred to as a "lower electrode," a "back gate electrode," or a "lower light blocking layer"). The gate electrode and the lower conductive layer BML of the first transistor M1 may overlap each other with an insulating layer interposed therebetween in a plan view. In an embodiment, the lower conductive layer BML may be connected to an electrode (e.g., a source or drain electrode of the first transistor M1).

In case that the first transistor M1 includes the lower conductive layer BML, there may be applied a back-biasing technique (or sync technique) for moving a threshold voltage of the first transistor M1 in a negative direction or positive direction by applying a back-biasing voltage to the lower conductive layer BML of the first transistor M1 in driving of the pixel PXL. For example, a source-sync technique may be applied by connecting the lower conductive layer BML to a source electrode of the first transistor M1, so that the threshold voltage of the first transistor M1 may be moved in the negative direction or positive direction. In case that the lower conductive layer BML is disposed on a bottom of a semiconductor pattern constituting a channel of the first transistor M1, the lower conductive layer BML may serve as a light blocking pattern, thereby stabilizing operational characteristics of the first transistor M1. However, a function and/or an application method of the lower conductive layer BML is not limited thereto.

The second transistor M2 may be connected between the data line DL and the first node N1. A gate electrode of the second transistor M2 may be connected to the scan line SL. The second transistor M2 may be turned on in case that a scan signal having a gate-on voltage (e.g., a high level voltage) is supplied from the scan line SL, to connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

An electrode of the storage capacitor Cst may be connected to the first node N1, and another electrode of the storage capacitor Cst may be connected to a second electrode (e.g., a source or drain electrode) of the first transistor M1. The storage capacitor Cst may charge a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, and the like), based on the provided voltage value. Extracted characteristic information may be used to convert image data such that a characteristic deviation between the pixels PXL is compensated.

Although an embodiment where the transistors M1, M2, and M3 included in the pixel circuit PXC are all implemented with an n-type transistor has been illustrated in FIG. 4, the disclosure is not limited thereto. For example, at least one of the first, second, and third transistors M1, M2, and M3 may be changed to a p-type transistor.

A structure and driving method of the pixel PXL may be variously changed in an embodiment. For example, the pixel circuit PXC may be configured as a pixel circuit having various structures and/or various driving methods, in addition to the embodiment shown in FIG. 4.

For example, the pixel circuit PXC may not include the third transistor M3. Also, the pixel circuit PXC may further include other circuit elements such as a compensation transistor for compensating for the threshold voltage of the first transistor M1, and the like, an initialization transistor for initializing a voltage of the first node N1 and/or the first connection electrode ELT1, an emission control transistor for controlling a period in which a driving current is supplied to the light emitting unit EMU, and/or a boosting capacitor for boosting the voltage of the first node N1.

The light emitting unit EMU may include at least one light emitting element LD (e.g., light emitting elements LD) connected between the first power source VDD and a second power source VSS.

For example, the light emitting unit EMU may include the first connection electrode ELT1 connected to the first power source VDD through the pixel circuit PXC and a first power line PL1, a fifth connection electrode ELT5 connected to the second power source VSS through a second power line PL2, and light emitting elements LD connected between the first and fifth connection electrodes ELT1 and ELT5.

The first power source VDD and the second power source VSS may have different potentials such that the light emitting elements LD may emit light. For example, the first power source VDD may be set as a high-potential power source, and the second power source VSS may be set as a low-potential power source.

In an embodiment, the light emitting unit EMU may include at least one serial stage. The at least one serial stage may include a pair of electrodes (e.g., two electrodes) and at least one light emitting element LD connected in a forward direction between the pair of electrodes. The number of serial stages constituting the light emitting unit EMU and the number of light emitting elements LD constituting each at least one serial stage are not limited. For example, the number of light emitting elements LD constituting each of the serial stages may be equal to or different from each other, and the number of the light emitting elements LD is not limited.

For example, the light emitting unit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 connected between the first and second connection electrodes ELT1 and ELT2. The at least one first light emitting element LD1 may be connected in a forward direction between the first and second connection electrodes ELT1 and EL2. For example, a first end portion EP1 of the at least one first light emitting element LD1 may be connected to the first connection electrode ELT1, and a second end portion EP2 of the at least one first light emitting element LD1 may be connected to the second connection electrode ELT2.

The second serial stage may include the second connection electrode ELT2 and a third connection electrode ELT3, and at least one second light emitting element LD2 connected between the second and third connection electrodes ELT2 and ELT3. The at least one second light emitting element LD2 may be connected in a forward direction between the second and third connection electrodes ELT2 and ELT3. For example, a first end portion EP1 of the at least one second light emitting element LD2 may be connected to the second connection electrode ELT2, and a second end portion EP2 of the at least one second light emitting element LD2 may be connected to the third connection electrode ELT3.

The third serial stage may include the third connection electrode ELT3 and a fourth connection electrode ELT4, and at least one third light emitting element LD3 connected between the third and fourth connection electrodes ELT3 and ELT4. The at least one third light emitting element LD3 may be connected in a forward direction between the third and fourth connection electrodes ELT3 and ELT4. For example, a first end portion EP1 of the at least one third light emitting element LD3 may be connected to the third connection electrode ELT3, and a second end portion EP2 of the at least one third light emitting element LD3 may be connected to the fourth connection electrode ELT4.

The fourth serial stage may include the fourth connection electrode ELT4 and the fifth connection electrode ELT5, and at least one fourth light emitting element LD4 connected between the fourth and fifth connection electrodes ELT4 and ELT5. The at least one fourth light emitting element LD4 may be connected in a forward direction between the fourth and fifth connection electrodes ELT4 and ELT5. For example, a first end portion EP1 of the at least one fourth light emitting element LD4 may be connected to the fourth connection electrode ELT4, and a second end portion EP2 of the at least one fourth light emitting element LD4 may be connected to the fifth connection electrode ELT5.

An electrode (e.g., the first connection electrode ELT1) of the light emitting unit EMU may be an anode electrode of the light emitting unit EMU. Another electrode (e.g., the fifth connection electrode ELT5) of the light emitting unit EMU may be a cathode electrode of the light emitting unit EMU.

The other electrodes (e.g., the second connection electrode ELT2, the third connection electrode ELT3, and/or the fourth connection electrode ELT4) of the light emitting unit EMU may constitute intermediate electrodes. For example, the second connection electrode ELT2 may constitute a first intermediate electrode IET1, the third connection electrode ELT3 may constitute a second intermediate electrode IET2, and the fourth connection electrode ELT4 may constitute a third intermediate electrode IET3.

In case that light emitting elements LD are connected in a series/parallel structure, power efficiency may be improved as compared with in case that light emitting elements LD of which number is equal to the above-described light emitting elements LD are connected only in parallel. In the pixel in which the light emitting elements LD are connected in the series/parallel structure, although a short defect or the like occurs in a serial stage, a predetermined luminance may be expressed through light emitting elements LD of another serial stage. Hence, a probability that a dark spot defect will occur in the pixel PXL may be reduced. However, the disclosure is not necessarily limited thereto, and the light emitting unit EMU may be configured by connecting the light emitting elements LD only in series or by connecting the light emitting elements LD only in parallel.

The at least one light emitting element LD may include the first end portion EP1 (e.g., a p-type end portion) connected to the first power source VDD via at least one electrode (e.g., the first connection electrode ELT1), the pixel circuit PXC, and/or the first power line PL1, and the second end portion EP2 (e.g., an n-type end portion) connected to the second power source VSS via at least another electrode (e.g., the fifth connection electrode ELT5) and the second power line PL2. For example, the light emitting elements LD may be connected in a forward direction between the first power source VDD and the second power source VSS. The light emitting elements LD connected in the forward direction may constitute effective light sources of the light emitting unit EMU.

In case that a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU may express the luminance corresponding to the driving current.

Hereinafter, a planar structure and a sectional structure of a pixel PXL in accordance with an embodiment of the disclosure will be described with reference to FIGS. 5 to 10.

Figure 5:
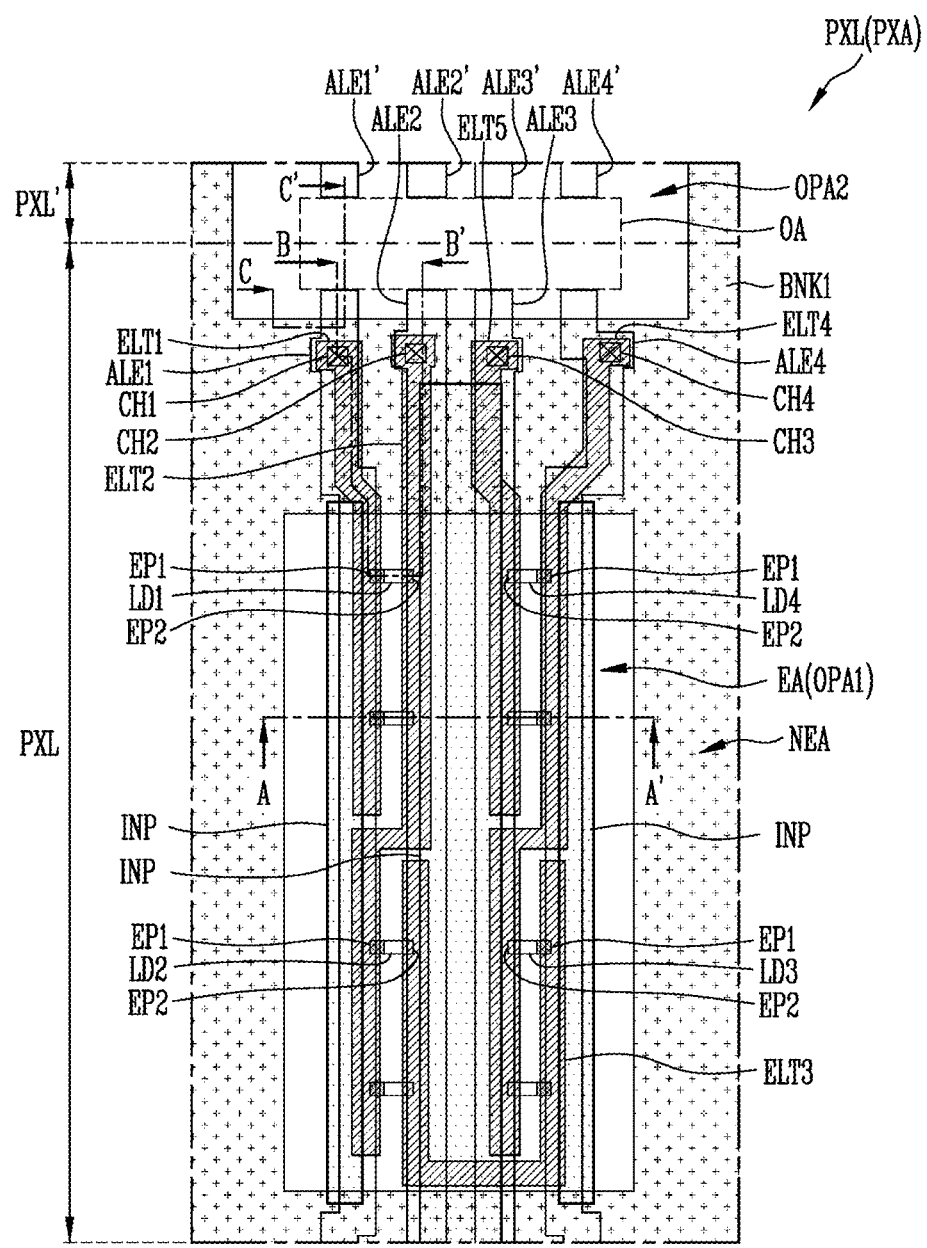
FIG. 5 is a schematic plan view illustrating a pixel in accordance with an embodiment of the disclosure.
Figure 6:
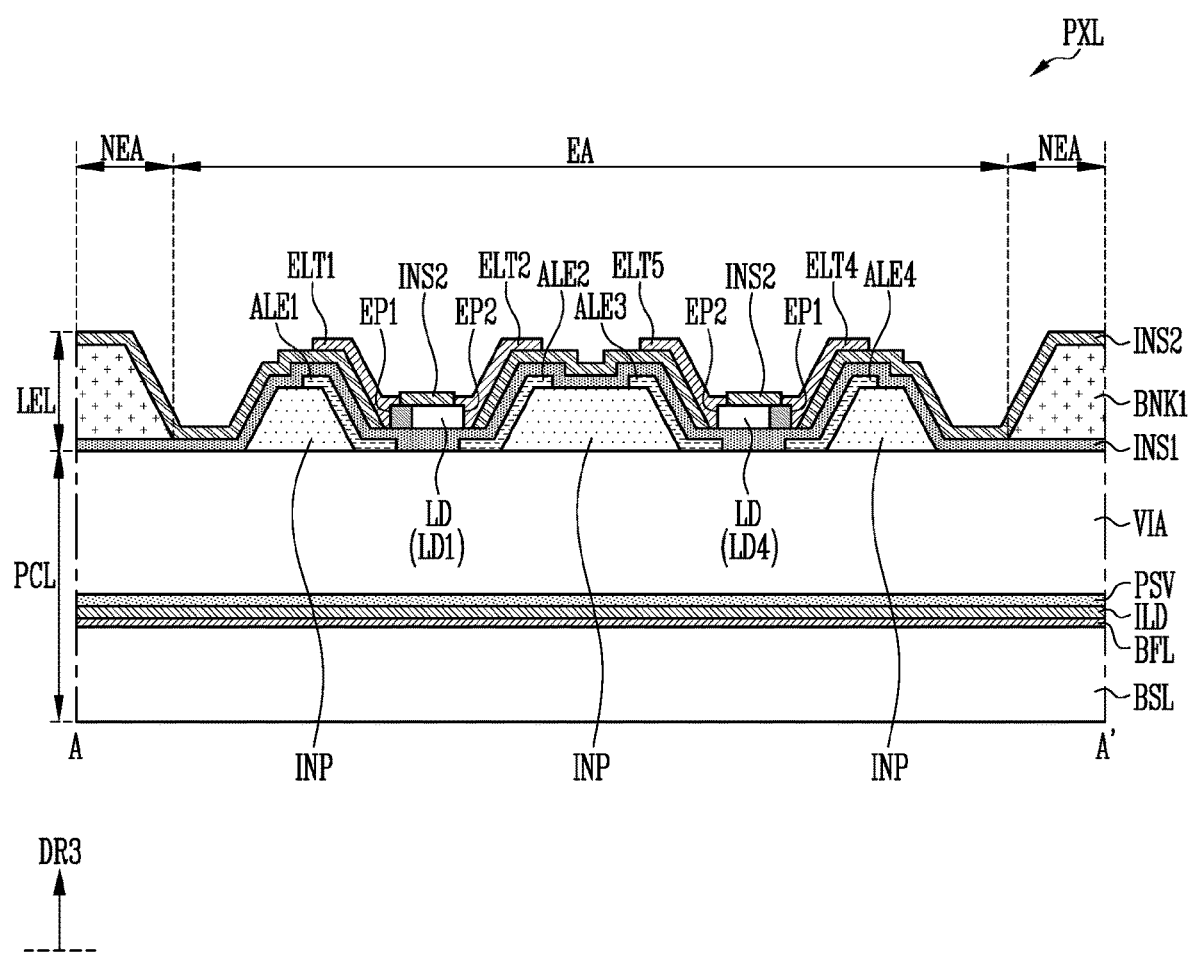
FIG. 6 is a schematic sectional view taken along line A-A' shown in FIG. 5.
Figure 7:
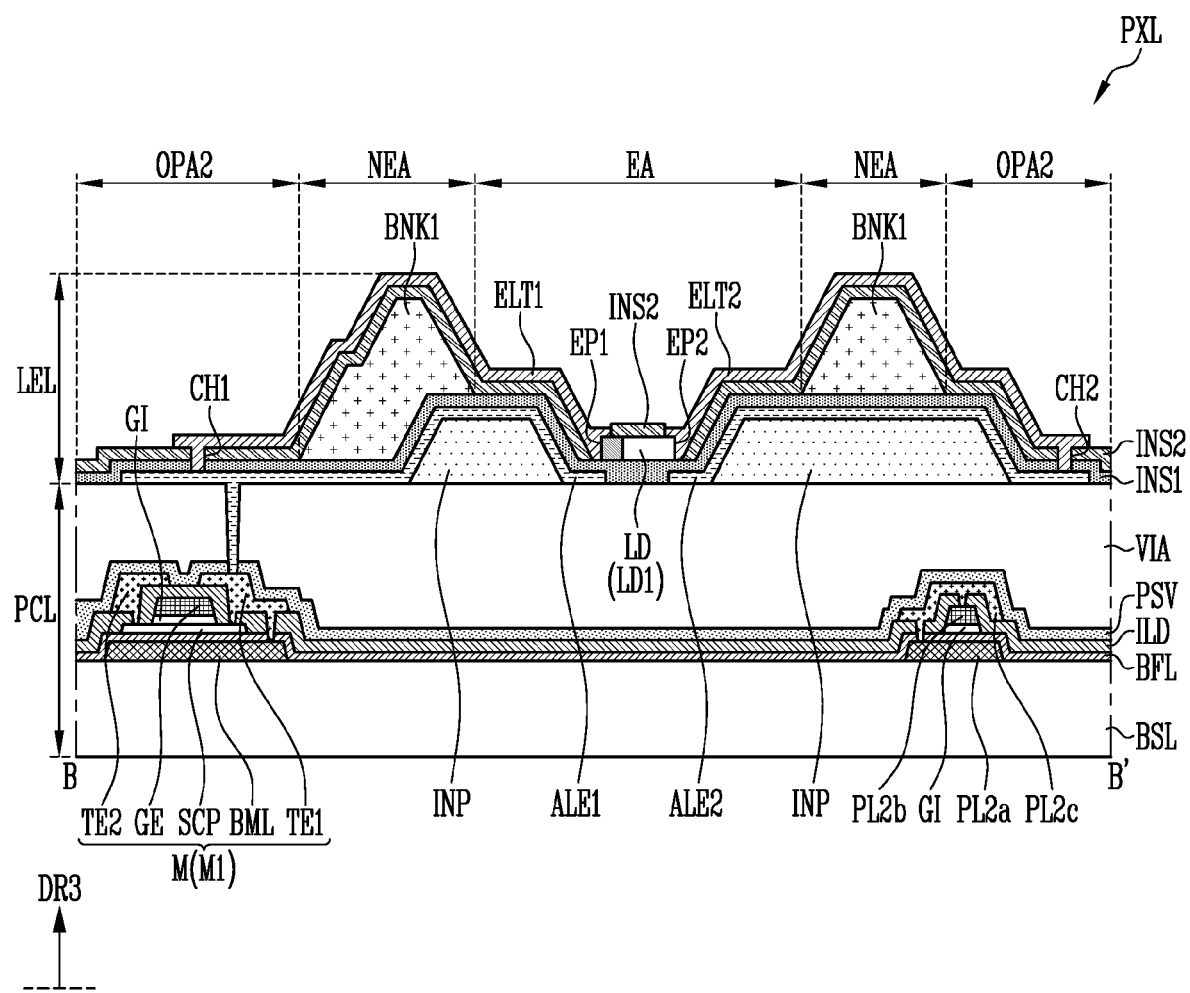
FIG. 7 is a schematic sectional view taken along line B-B' shown in FIG. 5.
Figure 8:
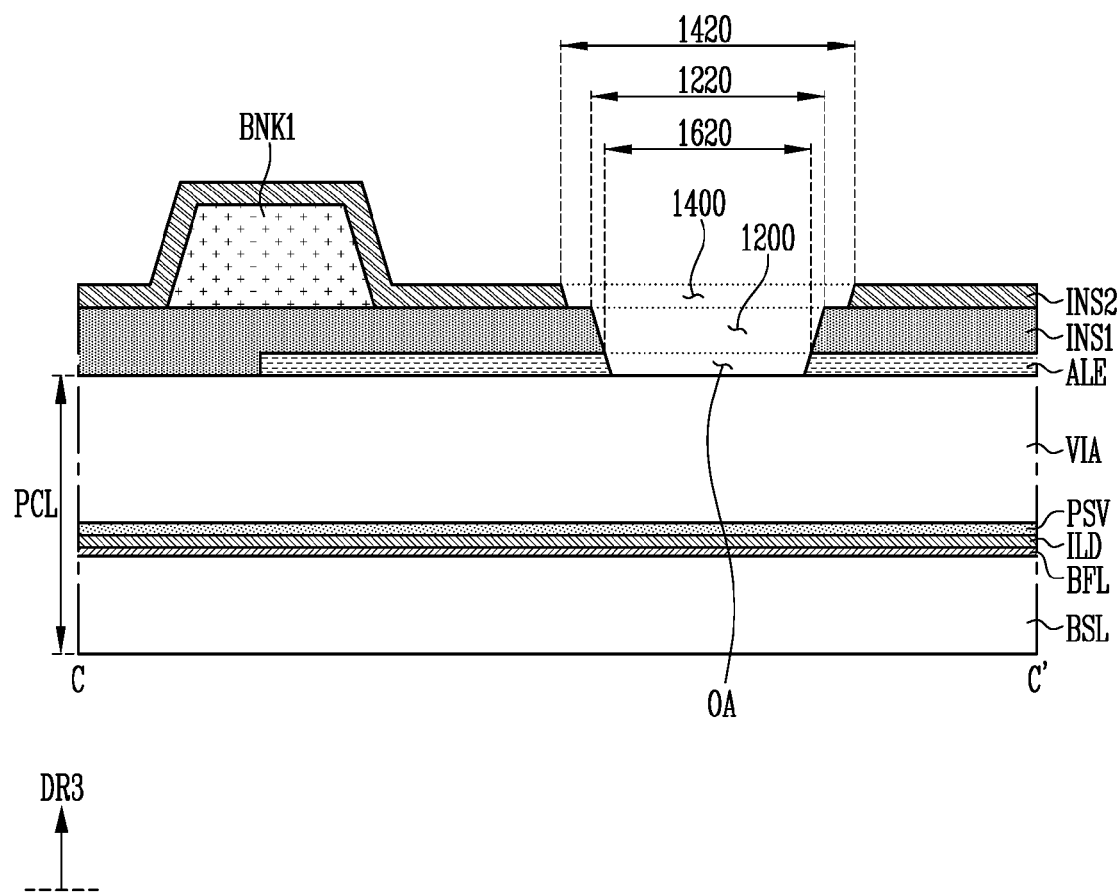
FIG. 8 is a schematic sectional view taken along line C-C' shown in FIG. 5.
Figure 9:
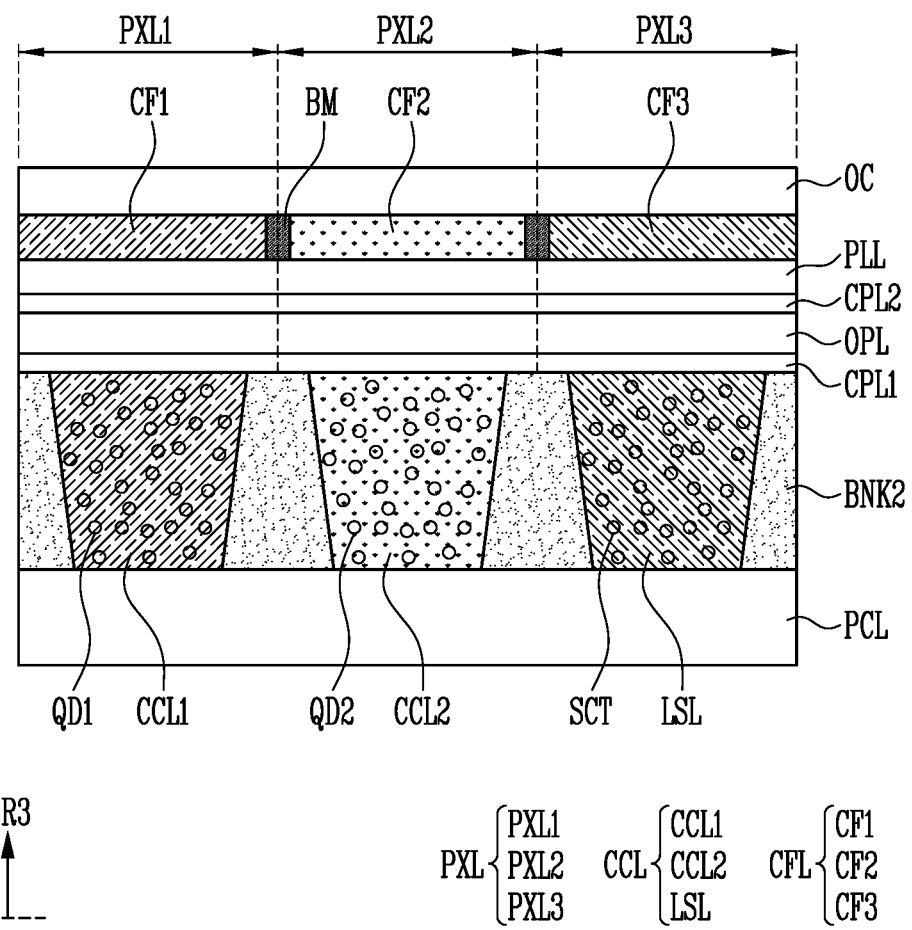
FIG. 9 is a schematic sectional view illustrating first to third pixels in accordance with an embodiment of the disclosure.
Figure 10:
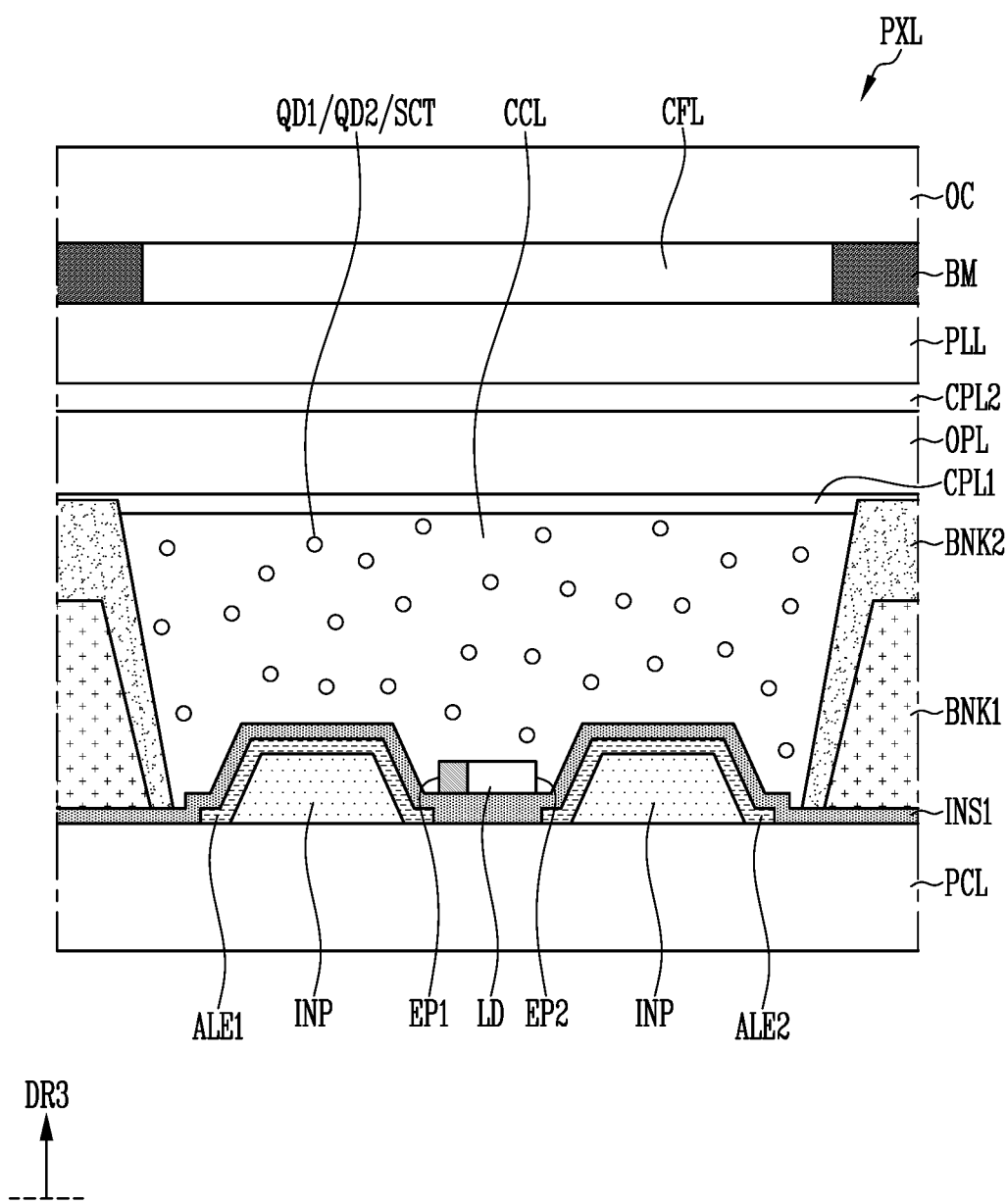
FIG. 10 is a schematic sectional view illustrating a pixel in accordance with an embodiment of the disclosure.

FIG. 5 is a schematic plan view illustrating a pixel in accordance with an embodiment of the disclosure. FIG. 6 is a schematic sectional view taken along line A-A' shown in FIG. 5. FIG. 7 is a schematic sectional view taken along line B-B' shown in FIG. 5. FIG. 8 is a schematic sectional view taken along line C-C' shown in FIG. 5. FIG. 9 is a schematic sectional view illustrating first to third pixels in accordance with an embodiment of the disclosure. FIG. 10 is a schematic sectional view illustrating a pixel in accordance with an embodiment of the disclosure.

For example, FIG. 5 illustrates a pixel area PXA in which a pixel PXL is disposed. The pixel PXL shown in FIG. 5 may be any of the first to third pixels PXL1, PXL2, and PXL3 constituting the pixel unit PXU shown in FIG. 3, and the first to third pixels PXL1, PXL2, and PXL3 may have structures substantially identical or similar to one another. Although an embodiment in which each pixel PXL includes light emitting elements LD disposed in four serial stages as shown in FIG. 4 is disclosed in FIG. 5, the number of the serial stages of each pixel PXL may be variously changed in an embodiment.

Hereinafter, in case that at least one of first to fourth light emitting elements LD1, LD2, LD3, and LD4 is arbitrarily designated or in case that two or more kinds of light emitting elements are inclusively designated, the corresponding light emitting element or the corresponding light emitting elements will be referred to as a "light emitting element LD" or "light emitting elements LD." In case that at least one electrodes including first to fourth electrodes ALE1, ALE2, ALE3, and ALE4 is arbitrarily designated or in case that two or more kinds of electrodes are inclusively designated, the corresponding electrode or the corresponding electrodes will be referred to as an "electrode ALE" or "electrodes ALE." In case that at least one connection electrode among connection electrodes including first to fifth connection electrodes ELT1, ELT2, ELT3, ELT4, and ELT5 is arbitrarily designated or in case that two or more kinds of connection electrodes are inclusively designated, the corresponding connection electrode or the corresponding connection electrodes will be referred to as a "connection electrode ELT" or "connection electrodes ELT."

Referring to FIG. 5, the pixel PXL may include an emission area EA and a non-emission area NEA. The emission area EA may be an area including the light emitting elements LD to emit light. The non-emission area NEA may be disposed to surround the emission area EA. The non-emission area NEA may be an area in which a first bank BNK1 surrounding the emission area EA is provided. The first bank BNK1 may include opening areas OPA including a first opening area OPA1 overlapping the emission area EA in a plan view and a second opening area OPA2 overlapping the non-emission area NEA in a plan view.

In accordance with an embodiment, the second opening area OPA2 may include an open area OA. For example, the open area OA may be included in the second opening OPA2. The open area OA may mean an area including an area spaced apart from each other between electrodes ALE and electrodes ALE'. The electrodes ALE' may be adjacent to the electrodes ALE.

Each pixel PXL may include the electrodes ALE, the light emitting elements LD, and/or connection electrodes ELT.

The electrodes ALE may be provided in at least the emission area EA. The electrodes ALE may extend in a second direction DR2, and may be spaced apart from each other in a first direction DR1. The electrodes ALE may extend from the emission area EA to the non-emission area NEA. For example, the electrodes ALE may extend from the emission area EA to the second opening area OPA2. Each of first to fourth electrodes ALE1, ALE2, ALE3, and ALE4 may extend in the second direction DR2, and may be spaced apart from each other in the first direction DR1 to be sequentially disposed.

Some of the electrodes ALE may be connected to a pixel circuit PXC (see, e.g., FIG. 4) and/or a power line. For example, the first electrode ALE1 may be connected to the pixel circuit PXC and/or a first power line PL1 (see, e.g., FIG. 4), and the third electrode ALE3 may be connected to a second power line PL2 (see, e.g., FIG. 4).

In an embodiment, some of the electrodes ALE may be electrically connected to some of the connection electrodes ELT through contact holes CH. For example, the first electrode ALE1 may be electrically connected to a first connection electrode ELT1 through a first contact hole CH1, the second electrode ELT2 may be electrically connected to a second connection electrode ELT2 through a second contact hole CH2, the third electrode ALE3 may be electrically connected to a fifth connection electrode ELT5 through a third contact hole CH3, and the fourth electrode ELT4 may be electrically connected to a fourth connection electrode ELT4 through a fourth contact hole CH4. The first to fourth contact holes CH1, CH2, CH3, and CH4 may be located in the second opening area OPA2. However, the disclosure is not limited thereto.

A pair of electrodes ALE adjacent to each other may be supplied with different signals in a process of aligning the light emitting elements LD. For example, in case that the first to fourth electrodes ALE1, ALE2, ALE3, and ALE4 are sequentially arranged in the first direction DR1 in the emission area EA, the first and second electrodes ALE1 and ALE2 may form a pair to be supplied with different alignment signals, and the third and fourth electrodes ALE3 and ALE4 may form a pair to be supplied with different alignment signals. The alignment signals may have different waveforms, different potentials, and/or different phases. Accordingly, an electric field may be formed between the first and second electrodes ALE1 and ALE2, so that the light emitting elements LD may be aligned between the first and second electrodes ALE1 and ALE2. Also, accordingly, an electric field may be formed between the third and fourth electrodes ALE3 and ALE4, so that the light emitting elements LD may be aligned between the third and fourth electrodes ALE3 and ALE4.

In an embodiment, the second and third electrodes ALE2 and ALE3 may be supplied with a same signal in the process of aligning the light emitting elements LD. Although a form in which the second and third electrodes ALE2 and ALE3 are separated from each other is illustrated in FIG. 5, the second and third electrodes ALE2 and ALE3 may be integrally or non-integrally connected to each other in the process of aligning the light emitting elements LD.

In accordance with an embodiment, at least some of the electrodes ALE of the pixel PXL may be separated from at least some of electrodes ALE' of another pixel PXL' adjacent to the pixel PXL with the open area OA interposed therebetween. For example, the first electrode ALE1 of the pixel PXL may be spaced apart from a first electrode ALE1' of the another pixel PXL', which is adjacent to the first electrode ALE1 in the second direction DR2. The second electrode ALE2 of the pixel PXL may be spaced apart from a second electrode ALE2' of the another pixel PXL', which is adjacent to the second electrode ALE2 in the second direction DR2. The third electrode ALE3 of the pixel PXL may be spaced apart from a third electrode ALE3' of the another pixel PXL', which is adjacent to the third electrode ALE3 in the second direction DR2. The fourth electrode ALE4 of the pixel PXL may be spaced apart from a fourth electrode ALE4' of the another pixel PXL', which is adjacent to the fourth electrode ALE4 in the second direction DR2.

In accordance with an embodiment, in order for the light emitting element LD to emit light, an anode signal may be supplied to the first electrode ALE1, and a cathode signal may be supplied to the third electrode ALE3. The first electrode ALE1 and the third electrode ALE3 of the pixel PXL may be separated from the first electrode ALE1' and the third electrode ALE3' of the another pixel PXL' adjacent to the pixel PXL, so that the pixel PXL may be individually driven. However, the disclosure is not limited to the above-described example. In an embodiment, the third electrode ALE3 of the pixel PXL and the third electrode ALE3' of the another pixel PXL' may be integral with each other.

In an embodiment, insulating patterns INP may be disposed on a bottom of the electrodes ALE. The insulating patterns INP may be provided in at least the emission area EA. The insulating patterns INP may extend in the second direction DR2, and may be spaced apart from each other in the first direction DR1.

As each of the insulating patterns INP is provided on the bottom of an area of each of the electrodes ALE, the area of each of the electrodes ALE may protrude in an upper direction of the pixel PXL, i.e., a third direction DR3 in an area in which each of the insulating patterns INP is formed. In case that the insulating patterns INP and/or the electrodes ALE include a reflective material, a reflective wall structure may be formed at a periphery of the light emitting elements LD. Accordingly, the light emitted from the light emitting elements LD may be emitted in the upper direction of the pixel PXL (e.g., a front direction of the display panel PNL, including a predetermined viewing angle range), and thus a light emission efficiency of the display panel PNL may be improved.

Each of the light emitting elements LD may be aligned between a pair of the electrodes ALE in the emission area EA. Also, each of the light emitting elements LD may be electrically connected between a pair of connection electrodes ELT.

A first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in a first area (e.g., an upper end area in the second direction DR2) of the first and second electrodes ALE1 and ALE2. A first end portion EP1 of the first light emitting element LD1 may be electrically connected to the first connection electrode ELT1, and a second end portion EP2 of the first light emitting element LD1 may be electrically connected to the second connection electrode ELT2.

A second light emitting element LD2 may be aligned between the first and second electrodes ALE1 and ALE2. The second light emitting element LD2 may be electrically connected between the second connection electrode ELT2 and a third connection electrode ELT3. For example, the second light emitting element LD2 may be aligned in a second area (e.g., a lower end area in the second direction DR2) of the first and second electrodes ALE1 and ALE2. A first end portion EP1 of the second light emitting element LD2 may be electrically connected to the second connection electrode ELT2, and a second end portion EP2 of the second light emitting element LD2 may be electrically connected to the third connection electrode ELT3.

A third light emitting element LD3 may be aligned between the third and fourth electrodes ALE3 and ALE4. The third light emitting element LD3 may be electrically connected between the third and fourth connection electrodes ELT3 and ELT4. For example, the third light emitting element LD3 may be aligned in a second area (e.g., a lower end area in the second direction DR2) of the third and fourth electrodes ALE3 and ALE4. A first end portion EP1 of the third light emitting element LD3 may be electrically connected to the third connection electrode ELT3, and a second end portion EP2 of the third light emitting element LD3 may be electrically connected to the fourth connection electrode ELT4.

A fourth light emitting element LD4 may be aligned between the third and fourth electrodes ALE3 and ALE4. The fourth light emitting element LD4 may be electrically connected between the fourth and fifth connection electrodes ELT4 and ELT5. For example, the fourth light emitting element LD4 may be aligned in a first area (e.g., an upper end area in the second direction DR2) of the third and fourth electrodes ALE3 and ALE4. A first end portion EP1 of the fourth light emitting element LD4 may be electrically connected to the fourth connection electrode ELT4, and a second end portion EP2 of the fourth light emitting element LD4 may be electrically connected to the fifth connection electrode ELT5.

For example, the first light emitting element LD1 may be located in a left upper end area of the emission area EA, and the second light emitting element LD2 may be located in a left lower end area of the emission area EA. The third light emitting element LD3 may be located at a right lower end area of the emission area EA, and the fourth light emitting element LD4 may be located in a right upper end area of the emission area EA. However, an arrangement and/or connection structure of the light emitting elements LD may be variously changed according to a structure of the light emitting unit EMU and/or the number of serial stages.

Each of the connection electrodes ELT may be provided in at least the emission area EA, and may be disposed to overlap at least one electrode ALE and/or at least one light emitting element LD in a plan view. For example, each of the connection electrodes ELT may be formed on the electrodes ALE and/or the light emitting elements LD to overlap the electrodes ALE and/or the light emitting elements LD in a plan view. Therefore, each of the electrodes ELT may be electrically connected to the light emitting elements LD.

The first connection electrode ELT1 may be disposed on the first area (e.g., the upper end area in the second direction DR2) of the first electrode ALE1 and the first end portions EP1 of the first light emitting elements LD1, to be electrically connected to the first end portions EP1 of the first light emitting elements LD1.

The second connection electrode ELT2 may be disposed on the first area (e.g., the upper end area in the second direction DR2) of the second electrode ALE2 and the second end portions EP2 of the first light emitting elements LD1, to be electrically connected to the second end portions EP2 of the first light emitting elements LD1. Also, the second connection electrode ELT2 may be disposed on the second area (e.g., the lower end area in the second direction DR2) of the first electrode ALE1 and the first end portions EP1 of the second light emitting elements LD2, to be electrically connected to the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other in the emission area EA. To this end, the second connection electrode ELT2 may have a bent shape. For example, the second connection electrode ELT2 may have a structure bent or curved at a boundary between an area in which at least one first light emitting element LD1 is arranged and an area in which at least one second light emitting element LD2 is arranged.

The third connection electrode ELT3 may be disposed on the second area (e.g., the lower end area in the second direction DR2) of the second electrode ALE2 and the second end portions EP2 of the second light emitting elements LD2, to be electrically connected to the second end portions EP2 of the second light emitting elements LD2. Also, the third connection electrode ELT3 may be disposed on the second area (e.g., the lower end area in the second direction DR2) of the fourth electrode ALE4 and the first end portions EP1 of the third light emitting elements LD3, to be electrically connected to the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other in the emission area EA. To this end, the third connection electrode ELT3 may have a bent shape. For example, the third connection electrode ELT3 may have a structure bent or curved at a boundary between an area in which at least one second light emitting element LD2 is arranged and an area in which at least one third light emitting element LD3 is arranged.

The fourth connection electrode ELT4 may be disposed on the second area (e.g., the lower end area in the second direction DR2) of the third electrode ALE3 and the second end portions EP2 of the third light emitting elements LD3, to be electrically connected to the second end portions EP2 of the third light emitting elements LD3. Also, the fourth connection electrode ELT4 may be disposed on the first area (e.g., the upper end area in the second direction DR2) of the fourth electrode ALE4 and the first end portions EP1 of the fourth light emitting elements LD4, to be electrically connected to the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other in the emission area EA. To this end, the fourth connection electrode ELT4 may have a bent shape. For example, the fourth connection electrode ELT4 may have a structure bent or curved at a boundary between an area in which at least one third light emitting element LD3 is arranged and an area in which at least one fourth light emitting element LD4 is arranged.

The fifth connection electrode ELT5 may be disposed on the first area (e.g., the upper end area in the second direction DR2) of the third electrode ALE3 and the second end portions EP2 of the fourth light emitting elements LD4, to be electrically connected to the second end portions EP2 of the fourth light emitting elements LD4.

In the above-described manner, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be sequentially connected in series by using the connection electrodes ELT.

Hereinafter, based on a light emitting element LD, a sectional structure of each pixel PXL will be described in detail with reference to FIGS. 6 and 7. FIGS. 6 and 7 illustrate a pixel circuit layer PCL and a light emitting element layer LEL. A first transistor M1 among various circuit elements constituting the pixel circuit PXC is illustrated in FIG. 7. In case that first to third transistors M1, M2, and M3 are designated without being distinguished from each other, each of the first to third transistors M1, M2, and M3 will be inclusively referred to as a "transistor M." A structure of transistors M and/or positions of the transistors M for each layer is not limited to the embodiment shown in FIG. 7, and may be variously changed in an embodiment.

Referring to FIGS. 6 and 7, the pixel circuit layer PCL and the light emitting element layer LEL of the pixel PXL in accordance with the embodiment of the disclosure may include circuit elements including transistors M disposed on a base layer BSL and various lines connected thereto. The light emitting element layer LEL including electrodes ALE (e.g., first to fourth electrodes ALE1 to ALE4), light emitting elements LD (e.g., first and fourth light emitting elements LD1 and LD4), and/or connection electrodes ELT (e.g., first, second, fourth, and fifth connection electrodes ELT1, ELT2, ELT4, and ELT5) may be disposed on the pixel circuit layer PCL.

The base layer BSL may be a rigid or flexible substrate or a film. For example, the base layer BSL may be a rigid substrate made of glass or tempered glass, a flexible substrate (or thin film) made of a plastic or metal material, or at least one insulating layer. A material and/or property of the base layer BSL is not limited. In an embodiment, the base layer BSL may be substantially transparent. The term "substantially transparent" may mean that light may be transmitted with a predetermined or selectable transmittance or more. In another embodiment, the base layer BSL may be translucent or opaque. Also, the base layer BSL may include a reflective material in an embodiment.

A lower conductive layer BML and a first power conductive layer PL2$a$ may be disposed on the base layer BSL. The lower conductive layer BML and the first power conductive layer PL2$a$ may be disposed on a same layer. For example, the lower conductive layer BML and the first power conductive layer PL2$a$ may be simultaneously formed through a same process, but the disclosure is not necessarily limited thereto. The first power conductive layer PL2$a$ may constitute the second power line PL2 described with reference to FIG. 4 and the like.

Each of the lower conductive layer BML and the first power conductive layer PL2$a$ may be formed as a single layer or a multi-layer, which is made of at least one of molybdenum (Mo), copper (Cu), aluminum (Al), chromium (Cr), gold (Au), titanium (Ti), nickel (Ni), neodymium (Nd), indium (In), and tin (Sn), and any oxide or ally thereof, or any combination thereof.

A buffer layer BFL may be disposed on the lower conductive layer BML and the first power conductive layer PL2$a$. The buffer layer BFL may prevent an impurity from being diffused into each of the circuit elements. The buffer layer BFL may be configured as a single layer, but may be configured as a multi-layer including at least two layers. In case that the buffer layer BFL is provided as the multi-layer, each of layers may be formed of a same material or be formed of different materials.

A semiconductor pattern SCP may be disposed on the buffer layer BFL. For example, the semiconductor pattern SCP may include a first region contacting a first transistor electrode TE1, a second region contacting a second transistor electrode ET2, and a channel region located between the first and second regions. In an embodiment, one of the first and second regions may be a source region, and the other of the first and second regions may be a drain region.

In an embodiment, the semiconductor pattern SCP may be made of at least one of poly-silicon, amorphous silicon, oxide semiconductor, and the like. The channel region of the semiconductor pattern SCP may be a semiconductor pattern undoped with an impurity, and may be an intrinsic semiconductor. Each of the first and second regions of the semiconductor pattern SCP may be a semiconductor pattern doped with an impurity.

A gate insulating layer GI may be disposed on the buffer layer BFL and the semiconductor pattern SCP. For example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

The gate electrode GE of the transistor M and the second power conductive layer PL2b may be disposed on the gate insulating layer GI. For example, the gate electrode GE and the second power conductive layer PL2b may be disposed on a same layer. For example, the gate electrode GE and the second power conductive layer PL2b may be simultaneously formed through a same process, but the disclosure is not necessarily limited thereto. The gate electrode GE may be disposed on the gate insulating layer GI to overlap the semiconductor pattern SCP in the third direction DR3 in a plan view. The second power conductive layer PL2b may be disposed on the gate insulating layer GI to overlap the first power conductive layer PL2a in the third direction DR3 in a plan view. The second power conductive layer PL2b along with the first power conductive layer PL2a may constitute the second power line PL2 described with reference to FIG. 4 and the like.

Each of the gate electrode GE and the second power conductive layer PL2b may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), and tin (Sn), and any oxide or alloy thereof, or any combination thereof.

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

The interlayer insulating layer ILD may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed on a same layer. For example, the first and second transistor electrodes TE1 and TE2 and the third power conductive layer PL2c may be simultaneously formed through a same process, but the disclosure is not necessarily limited thereto.

The first and second transistor electrodes TE1 and TE2 may be disposed to overlap the semiconductor pattern SCP in the third direction DR3 in a plan view. The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. Also, the first transistor electrode TE1 may be electrically connected to the lower conductive layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In an embodiment, one of the first and second transistor electrodes TE1 and TE2 may be a source electrode, and the other of the first and second transistor electrodes TE1 and TE2 may be a drain electrode.

The third power conductive layer PL2c may be disposed to overlap the first power conductive layer PL2a and/or the second power conductive layer PL2b in the third direction DR3 in a plan view. The third power conductive layer PL2c may be electrically connected to the first power conductive layer PL2a and/or the second power conductive layer PL2b. For example, the third power conductive layer PL2c may be electrically connected to the first power conductive layer PL2a through a contact hole penetrating the interlayer insulating layer ILD and the buffer layer BFL. Also, the third power conductive layer PL2c may be electrically connected to the second power conductive layer PL2b through a contact hole penetrating the interlayer insulating layer ILD. The third power conductive layer PL2c along with the first power conductive layer PL2a and/or the second power conductive layer PL2b may constitute the second power line PL2 described with reference to FIG. 4 and the like.

The first and second transistor electrodes TE1 and TE2 and the third power conductive layer PL2c may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), and tin (Sn), and any oxide or alloy thereof, or any combination thereof.

A protective layer PSV may be disposed on the first and second transistor electrodes TE1 and TE2 and the third power conductive layer PL2c. The protective layer PSV may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

A via layer VIA may be disposed on the protective layer PSV. The via layer VIA may be made of an organic material to planarize a lower step difference. For example, the via layer VIA may include an organic material such as acrylic resin, epoxy resin, phenolic resin, polyamides resin, polyimides resin, polyester resin, poly-phenylene sulfide resin, benzocyclobutene (BCB), or the like. However, the disclosure is not necessarily limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

Insulating patterns INP of the light emitting element layer LEL may be disposed on the via layer VIA of the pixel circuit layer PCL. In an embodiment, the insulating patterns INP may have various shapes. In an embodiment, the insulating patterns INP may have a shape protruding in the third direction DR3 on the base layer BSL. Also, the insulating patterns INP may have an inclined surface inclined at an angle (e.g., a predetermined or selectable angle) with respect to the base layer BSL. However, the disclosure is not necessarily limited thereto, and the insulating patterns INP may have a sidewall having a curved shape, a stepped shape, or the like. For example, the insulating patterns INP may have a section having a semicircular shape, a semi-elliptical shape, or the like.

In an embodiment, the via layer VIA may be designated as a lower insulating layer.

Electrodes ALE and a first insulating layer INS1, which are disposed on a top of the insulating patterns INP, may have a shape corresponding to the insulating patterns INP. For example, the electrodes ALE disposed on the insulating patterns INP may include an inclined surface or a curved surface, which has a shape corresponding to a shape of the insulating patterns INP. Accordingly, the insulating patterns INP along with the electrodes ALE provided on the top thereof may serve as a reflective member for guiding light emitted from light emitting elements LD in a front direction of the pixel PXL, i.e., the third direction DR3, thereby improving a light emission efficiency of the display panel PNL.

The insulating patterns INP may include at least one organic material and/or at least one inorganic material. For example, the insulating patterns INP may include an organic material such as acrylic resin, epoxy resin, phenolic resin, polyamide resin, polyimide resin, polyester resin, poly-phenylene sulfide resin, benzocyclobutene (BCB), or the like. However, the disclosure is not necessarily limited thereto, and the insulating patterns INP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

The electrodes ALE may be disposed on the via layer VIA and the insulating patterns INP. The electrodes ALE may be disposed to be spaced apart from each other in the pixel PXL. The electrodes ALE may be disposed on a same layer. The electrodes ALE may be simultaneously formed through a same process, but the disclosure is not necessarily limited thereto.

The electrodes ALE may be supplied with an alignment signal in a process of aligning the light emitting elements LD. Accordingly, an electric filed may be formed between the electrodes ALE, so that the light emitting elements LD provided in each pixel PXL may be aligned between the electrodes ALE.

The electrodes ALE may include at least one conductive material. For example, the electrodes ALE may include at least one metal or alloy, or any combination thereof among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), or Fluorine doped Tin Oxide (FTO), and at least one conductive material among conductive polymers such as PEDOT, but the disclosure is not necessarily limited thereto.

The first insulating layer INS1 may be disposed on the electrodes ALE. The first insulating layer INS1 may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

A first bank BNK1 may be disposed on the first insulating layer INS1. The first bank BNK1 may form a dam structure defining an emission area in which light emitting elements LD are to be supplied in a process of supplying the light emitting elements LD to each of the pixels PXL. The first bank BNK1 may protrude in a thickness direction of the base layer BSL (e.g., the third direction DR3). For example, a desired kind and/or amount of light emitting element ink may be supplied to the emission area defined by the first bank BNK1.

The first bank BNK1 may include an organic material such as acrylic resin, epoxy resin, phenolic resin, polyamide resin, polyimide resin, polyester resin, poly-phenylene sulfide resin, benzocyclobutene (BCB), or the like. However, the disclosure is not necessarily limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

In an embodiment, the first bank BNK1 may include at least one light blocking material and/or at least one reflective material. Accordingly, light leakage between adjacent pixels PXL may be prevented. For example, the first bank BNK1 may include at least one black matrix material and/or at least one color filter material. For example, the first bank BNK1 may be formed as a black opaque pattern configured to block transmission of light. In an embodiment, a reflective layer or the like may be formed on a surface (e.g., a sidewall) of the first bank BNK1 to improve a light efficiency of each pixel PXL.

The light emitting elements LD may be disposed on the first insulating layer INS1. The light emitting elements LD may be disposed in an area surrounded by the first bank BNK1. The light emitting elements LD may be disposed between the electrodes ALE on the first insulating layer INS1. The light emitting elements LD may be prepared in a form in which the light emitting elements LD are dispersed in a light emitting element ink, to be supplied to each of the pixels PXL through an inkjet printing process, or the like. For example, the light emitting elements LD may be dispersed in a volatile solvent to be provided to each pixel PXL. Subsequently, in case that an alignment signal is supplied through the electrodes ALE, the light emitting elements LD may be aligned between the electrodes ALE, while an electric field is formed between the electrodes ALE. After the light emitting elements LD are aligned, the volatile solvent may be volatilized or removed through other processes, so that the light emitting elements LD may be stably arranged between the electrodes ALE.

A second insulating layer INS2 may be disposed on the light emitting elements LD. For example, the second insulating layer INS2 may be partially provided on the light emitting elements LD, and may expose first and second end portions EP1 and EP2 of the light emitting elements LD. In case that the second insulating layer INS2 is formed on the light emitting elements LD after an alignment of the light emitting elements LD is completed, the light emitting elements LD may be prevented from being separated from a position at which the light emitting elements LD are aligned.

In an embodiment, a portion of the second insulating layer INS2 may be disposed on the first insulating layer INS1 and/or the first bank BNK1. For example, the second insulating layer INS2 may be disposed in at least a partial area of the pixel PXL while exposing at least a portion of the light emitting element LD.

The second insulating layer INS2 may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

The connection electrodes ELT may be disposed on the first and second end portions EP1 and EP2 of the light emitting elements LD, which are exposed by the second insulating layer INS2. The connection electrodes ELT may be disposed on a same layer. For example, the connection electrodes ELT may be configured as a same conductive layer. The connection electrodes ELT may be simultaneously formed through a same process. However, the disclosure is not limited to the above-described example. For example, the connection electrodes ELT may be formed through different processes. For example, a first connection electrode ELT1, a third connection electrode ELT3 (ELT3 of FIG. 5), and a fifth electrode ELT5 may be patterned through a process, and a second connection electrode ELT2 and a fourth connection electrode ELT4 may be patterned through another process.

The first connection electrode ELT1 may be disposed (e.g., directly disposed) on first end portions EP1 of first light emitting elements LD1, to contact the first end portions EP1 of the first light emitting elements LD1.

The second connection electrode ELT2 may be disposed (e.g., directly disposed) on second end portions EP2 of the first light emitting elements LD1, to contact the second end portions EP2 of the first light emitting elements LD1. Also, although not shown in FIGS. 6 and 7, the second connection electrode ELT2 may be disposed (e.g., directly disposed) on first end portions of second light emitting elements LD2, to contact the first end portions of the second light emitting elements LD2. For example, the second connection electrode ELT2 may electrically connect the second end portions EP2 of the first light emitting elements LD1 and the first end portions of the second light emitting elements LD2 to each other.

Although not shown in FIGS. 6 and 7, similarly, the third connection electrode ELT3 may be disposed (e.g., directly disposed) on second end portions of the second light emitting elements LD2, to contact the second end portions of the second light emitting elements LD2. Also, although not shown in FIGS. 6 and 7, the third connection electrode ELT3 may be disposed (e.g., directly disposed) on first end portions of third light emitting elements LD3, to contact the first end portions of the third light emitting elements LD3. For example, the third connection electrode ELT3 may electrically connect the second end portions of the second light emitting elements LD2 and the first end portions of the third light emitting elements LD3 to each other.

Although not shown in FIGS. 6 and 7, similarly, the fourth connection electrode ELT4 may be disposed (e.g., directly disposed) on second end portions EP2 of the third light emitting elements LD3, to contact the second end portions EP2 of the third light emitting elements LD3 (not shown in FIGS. 6 and 7). Also, the fourth connection electrode ELT4 may be disposed (e.g., directly disposed) on first end portions EP1 of fourth light emitting elements LD4, to contact the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other.

Similarly, the fifth connection electrode ELT5 may be disposed (e.g., directly disposed) on second end portions EP2 of the fourth light emitting elements LD4, to contact the second end portions EP2 of the fourth light emitting elements LD4.

The connection electrodes ELT may be configured with various transparent conductive materials. For example, the connection electrodes ELT may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), or any combination thereof, and may be implemented substantially transparently or translucently to satisfy a transmittance (e.g., a predetermined or selectable transmittance). Accordingly, light emitted from the first and second end portions EP1 and EP2 of the light emitting elements LD may be emitted to an outside of the display panel PNL while passing through the connection electrodes ELT.

In accordance with an embodiment, the connection electrodes ELT may be electrically connected to the electrodes ALE through a contact hole CH. For example, the first connection electrode ELT1 may be electrically connected to the first electrode ALE1 through a first contact hole CH1, and the second connection electrode ELT2 may be electrically connected to the second electrode ALE2 through a second contact hole CH2.

As described above, the open area OA may be disposed in the second opening area OPA2. The open area OA may be formed by etching a base electrode for forming the electrodes ELT after the base electrode is deposited. In accordance with an embodiment, a mask used in an etching process for forming the open area OA may be identical to a mask used in an etching process for forming the second insulating layer INS2. Accordingly, the number of masks may be reduced, so that process cost may be saved. This will be described in detail below.

A stacked structure of the pixel PXL is not limited to the above-described example. For example, although not shown in a separate drawing, an additional insulating layer may be further disposed at an outer portion of the light emitting element layer LEL.

FIG. 8 illustrates a schematic sectional structure of the pixel PXL, based on an area in which the open area OA is formed. In FIG. 8, for convenience of description, the first electrode ALE1 may be inclusively described as electrodes ALE.

Referring to FIG. 8, the first insulating layer INS1 may form a first opening 1200. In accordance with an embodiment, the first opening 1200 may overlap the open area OA in a plan view. The first opening 1200 may be an area in which the first insulating layer INS1 is not disposed, and may expose portions of the electrodes ALE and a portion of the via layer VIA. For example, the first opening 1200 may cover (or overlap) top surfaces of the electrodes ALE, and may expose side surfaces of the electrodes ALE.

In accordance with an embodiment, the second insulating layer INS2 may form a second opening 1400. In accordance with an embodiment, the second opening 1400 may overlap the open area OA in a plan view. The second opening 1400 may be an area in which the second insulating layer INS2 is not disposed, and may expose a portion of the first insulating layer INS1, portions of the electrodes ALE, and a portion of the via layer VIA. For example, the second opening 1400 may exposed top and side surfaces of the first insulating layer INS1. The second opening 1400 may expose side surfaces of the electrodes ALE.

In accordance with an embodiment, the second opening 1400 may be formed wider than the first opening 1200. For example, the first opening 1200 may be disposed in the second opening 1400 in a plan view. In an embodiment, the second opening 1400 may be entirely covered by the first opening 1200. For example, the second opening 1400 may entirely overlap the first opening 1200 in a plan view.

In accordance with an embodiment, the first opening 1200 may have a first width 1220, and the second opening 1400 may have a second width 1420. The open area OA may have an open width 1620. In an embodiment, the second width 1420 may be greater than each of the first width 1220 and the open width 1620. The second width 1420 may be greater than the open width 1620. Each of the first width 1220, the second width 1420, and the open width 1620 may be a width with respect to a direction in which the electrodes ALE are spaced apart from each other so as to form the open area OA.

In accordance with an embodiment, in a plan view, the first insulating layer INS1 may include a first area which overlaps the electrodes ALE but does not overlap the second insulating layer INS2 and a second area which overlaps the electrodes ALE and overlaps the second insulating layer INS2.

Accordingly, the open area OA may be disposed in the second opening 1400 entirely overlapping the open area OA in a plan view. This may result from that a residual bank pattern RBNK (see e.g. FIG. 13) formed in a same process as the first bank BNK1 is formed in the first opening 1200 in a phase before the electrodes ALE are etched so as to manufacture the open area OA. This will be described in detail below.

FIG. 9 illustrates a second bank BNK2, a color conversion layer CCL, an optical layer OPL, and/or a color filter layer CFL. In FIG. 9, for convenience of description, a portion of the detailed configuration of the pixel circuit layer PCL and the light emitting element layer LEL, which are shown in FIGS. 6 and 7, will be omitted. FIG. 10 illustrates in detail a stacked structure of a pixel PXL in relation to the second bank BNK2, the color conversion layer CCL, the optical layer OPL, and/or the color filter layer CFL. In FIG. 10, for convenience of description, a portion of electrode layers and insulating layers is omitted.

Referring to FIGS. 9 and 10, the second bank BNK2 may be disposed between first to third pixels PXL1, PXL2, and PXL3 or at a boundary of the first to third pixels PXL1, PXL2, and PXL3, and may include an opening overlapping each of the first to third pixels PXL1, PXL2, and PXL3 in a plan view. The opening of the second bank BNK2 may provide a space in which the color conversion layer CCL may be provided. For example, a desired kind and/or a desired amount of color conversion layer CCL may be supplied to the space partitioned by the opening of the second bank BNK2.

The second bank BNK2 may include an organic material such as acrylic resin, epoxy resin, phenolic resin, polyamide resin, polyimide resin, unsaturated polyester resin, poly-phenylene ether resin, poly-phenylene sulfide resin, benzo-cyclobutene (BCB), or any combination thereof. However, the disclosure is not necessarily limited thereto, and the second bank BNK2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or any combination thereof.

In an embodiment, the second bank BNK2 may include at least one light blocking material and/or at least one reflective material. Accordingly, light leakage between adjacent pixels PXL may be prevented. For example, the second bank BNK2 may include a black pigment, but the disclosure is not necessarily limited thereto.

The color conversion layer CCL may be disposed above light emitting elements LD in the opening of the second bank BNK2. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of a same color. For example, the first to third pixels PXL1, PXL2, and PXL3 may include light emitting elements LD emitting light of a third color (or blue). The color conversion layer CCL including color conversion particles may be disposed on each of the first to third pixels PXL1, PXL2, and PXL3, so that a full-color image may be displayed.

The first color conversion layer CCL1 may include first color conversion particles for converting light of the third color, which is emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting light of blue, and the first pixel PXL1 is a red pixel, the first color conversion layer CCL1 may include a first quantum dot QD1 for converting light of blue, which is emitted from the blue light emitting element, into light of red. The first quantum dot QD1 may absorb blue light, and may emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

The second color conversion layer CCL2 may include second color conversion particles for converting light of the third color, which is emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting light of blue, and the second pixel PXL2 is a green pixel, the second color conversion layer CCL2 may include a second quantum dot QD2 for converting light of blue, which is emitted from the blue light emitting element, into light of green. The second quantum dot QD2 may absorb blue light, and may emit green light by shifting a wavelength of the blue light according to energy transition. In case that the second pixel PXL2 is a pixel of another color, the second color conversion layer CCL2 may include a second quantum dot QD2 corresponding to a color of the second pixel PXL2.

In an embodiment, light of blue having a relatively short wavelength in a visible light band may be incident into the first quantum dot QD1 and the second quantum dot QD2, so that absorption coefficients of the first quantum dot QD1 and the second quantum dot QD2 may be increased. Accordingly, an efficiency of light finally emitted from the first pixel PXL1 and the second pixel PXL2 may be improved, and excellent color reproduction may be ensured. The light emitting unit EMU of each of the first to third pixels PXL1, PXL2, and PXL3 may be configured by using light emitting elements of a same color (e.g., blue light emitting elements), so that a manufacturing efficiency of the display device may be improved.

The light scattering layer LSL may be provided to efficiently use the light of the third color (or blue) emitted from the light emitting element LD. For example, in case that the light emitting element LD is a blue light emitting element emitting light of blue, and the third pixel PXL3 is a blue pixel, the light scattering layer LSL may include at least one kind of light scattering particle SCT to efficiently use light emitted from the light emitting element LD. For example, the at least one kind of light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), zinc oxide (ZnO), or any combination thereof. The light scattering particle SCT may be not disposed only in the third pixel PXL3, and may be selectively included in the first color conversion layer CCL2 or the second color conversion layer CCL2. In an embodiment, the light scattering particle SCT may be omitted such that the light scattering layer LSL configured with transparent polymer is provided.

A first capping layer CPL1 may be disposed on the color conversion layer CCL. The first capping layer CPL1 may be provided throughout the first to third pixels PXL1, PXL2, and PXL3. The first capping layer CPL1 may cover the color conversion layer CCL. The first capping layer CPL1 may prevent the color conversion layer CCL from being damaged or contaminated due to infiltration of an impurity such as moisture or air from an outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like, or any combination thereof.

The optical layer OPL may be disposed on the first capping layer CPL. The optical layer OPL may function to improve light extraction efficiency by recycling light provided from the color conversion layer CCL through total reflection. To this end, the optical layer OPL may have a refractive index relatively lower than a refractive index of the color conversion layer CCL. For example, the refractive index of the color conversion layer may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided throughout the first to third pixels PXL1, PXL2, and PXL3. The second capping layer CPL2 may cover the optical layer OPL. The second capping layer CPL2 may prevent the optical layer OPL from being damaged or contaminated due to infiltration of an impurity such as moisture or air from an outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like, or any combination thereof.

A planarization layer PLL may be disposed on the second capping layer CPL2. The planarization layer PLL may be provided throughout the first to third pixels PXL1, PXL2, and PXL3.

The planarization layer PLL may include an organic material such as acrylic resin, epoxy resin, phenolic resin, polyamide resin, polyimide resin, unsaturated polyester resin, poly-phenylene ether resin, poly-phenylene sulfide resin, benzocyclobutene (BCB), or the like. However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$) or any combination thereof.

The color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third pixels PXL1, PXL2, and PXL3 may be disposed, so that a full-color image may be displayed.

The color filter layer CFL may include a first color filter CF1 disposed in the first pixel PXL1 to allow light emitted from the first pixel PXL1 to be selectively transmitted therethrough, a second color filter CF2 disposed in the second pixel PXL2 to allow light emitted from the second pixel PXL2 to be selectively transmitted therethrough, and a third color filter CF3 disposed in the third pixel PXL3 to allow light emitted from the third pixel PXL3 to be selectively transmitted therethrough.

In an embodiment, the first color filter CF1, the second color filter CF2, and the third color filter CF3 may be a red color filter, a green color filter, and a blue color filter each other, but the disclosure is not necessarily limited thereto. Hereinafter, in case that an arbitrary color filter among the first color filter CF1, the second color filter CF2, and the third color filter CF3 is designated, or in case that two or more kinds of color filters are inclusively designated, the corresponding color filter or the corresponding color filters are referred to as a "color filter CF" or "color filters CF."

The first color filter CF1 may overlap the first color conversion layer CCL1 of the first pixel PXL1 in the third direction DR3 in a plan view. The first color filter CF1 may include a color filter material for allowing light of a first color (or red) to be selectively transmitted therethrough. For example, in case that the first pixel PXL1 is a red pixel, the first color filter CF1 may include a red color filter material.

The second color filter CF2 may overlap the second color conversion layer CCL2 of the second pixel PXL2 in the third direction DR3 in a plan view. The second color filter CF2 may include a color filter material for allowing light of a second color (or green) to be selectively transmitted therethrough. For example, in case that the second pixel PXL2 is a green pixel, the second color filter CF2 may include a green color filter material.

The third color filter CF3 may overlap the light scattering layer LSL of the third pixel PXL3 in the third direction DR3 in a plan view. The third color filter CF3 may include a color filter material for allowing light of a third color (or blue) to be selectively transmitted therethrough. For example, in case that the third pixel PXL3 is a blue pixel, the third color filter CF3 may include a blue color filter material.

In an embodiment, a light blocking layer BM may be further disposed between the first to third color filters CF1, CF2, and CF3. As described above, in case that the light blocking layer BM is formed between the first to third color filters CF1, CF2, and CF3, a color mixture defect viewed at a front or side of the display device may be prevented. A material of the light blocking layer BM is not limited, and the light blocking layer BM may be configured with various light blocking materials. For example, the light blocking layer BM may be implemented by stacking the first to third color filters CF1, CF2, and CF3.

An overcoat layer OC may be disposed on the color filter layer CFL. The overcoat layer OC may be provided throughout the first to third pixels PXL1, PXL2, and PXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as acrylic resin, epoxy resin, phenolic resin, polyamide resin, polyimide resin, unsaturated polyester resin, poly-phenylene ether resin, poly-phenylene sulfide resin, benzocyclobutene (BCB), or the like. However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$) or any combination thereof.

Hereinafter, a manufacturing method for the display device in accordance with an embodiment of the disclosure will be described with reference to FIGS. 11 to 21.

FIGS. 11 to 21 are schematic sectional views illustrating a manufacturing method for the display device in accordance with an embodiment of the disclosure.

FIGS. 11, 13, 16, 18, and 20 are views illustrating process phases of a manufacturing method for the display device in accordance with an embodiment of the disclosure, and may be views illustrating a manufacturing method with respect to a sectional structure taken along the line C-C' shown in FIG. 5. FIGS. 12, 14, 15, 17, 19, and 21 are views illustrating process phases of a manufacturing method for the display device in accordance with an embodiment of the disclosure, and may be views illustrating a manufacturing method with respect to a sectional structure taken along the line A-A' shown in FIG. 5. In FIGS. 11 to 21, for convenience of description, layers except a conductive layer CL as layers disposed between the base layer BSL and the via layer VIA are inclusively described as a lower layer 100. For convenience of description, illustrating of the protective layer PSV disposed on the conductive layer CL is omitted.

Figure 11:
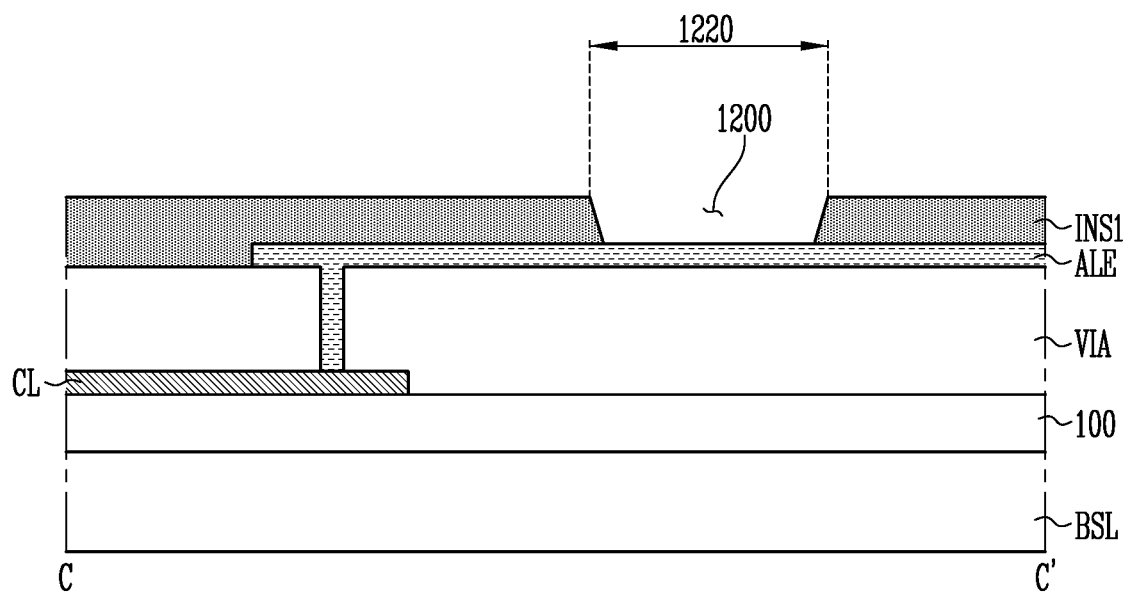
FIGS. 11 to 21 are schematic sectional views illustrating a manufacturing method for the display device in accordance with an embodiment of the disclosure.
Figure 12:
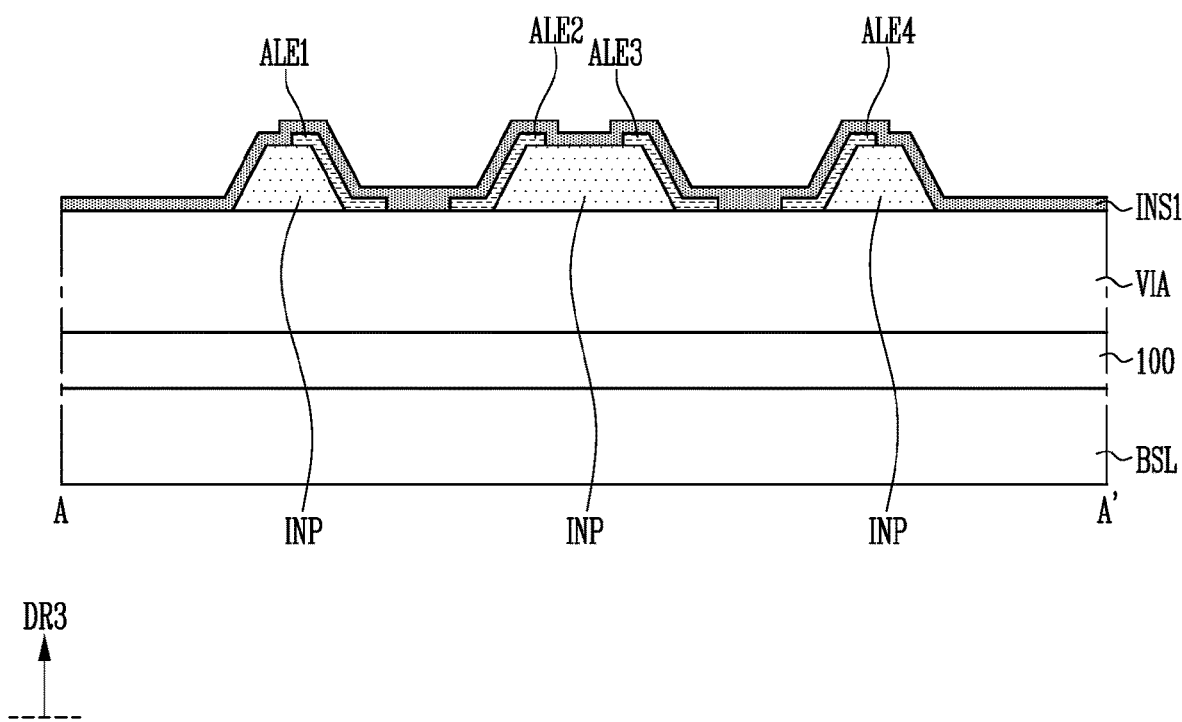

Referring to FIGS. 11 and 12, the lower layer 100 may be disposed on the base layer BSL, and the conductive layer CL may be disposed on the lower layer 100. Electrodes ALE may be disposed on the via layer VIA, and a first insulating layer INS1 may be patterned on the via layer VIA and the electrodes ALE.

In this phase, components disposed on the base layer BSL (e.g., components included in the pixel circuit layer PCL) may be formed by patterning a conductive layer (or metal layer), an inorganic material, an organic material, or the like through an ordinary process using a mask.

In accordance with an embodiment, the conductive layer CL may mean at least one of the first transistor electrode TE1, the second transistor electrode TE2, and the third power conductive layer PL2c or any configuration disposed in or on the same conductive layer.

In this phase, the conductive layer CL may be formed on the lower layer 100, to be covered by the via layer VIA. For convenience of description, the illustration of the protective layer PSV is omitted. However, in accordance with an embodiment, a structure may be provided, in which the protective layer PSV is disposed on the conductive layer CL, and the via layer VIA is disposed on the protective layer PSV.

In this phase, first to fourth electrodes ALE1 to ALE4 may be disposed to be spaced apart from each other, to form an area in which light emitting elements LD may be aligned. In accordance with an embodiment, some of the electrodes ALE may be disposed on an insulating pattern INP, to form a reflective wall. In an embodiment, the electrodes ALE may be electrically connected to the conductive layer CL through a contact part.

In this phase, the first insulating layer INS may be patterned on the via layer VIA, the insulating pattern INP, and the first to fourth electrodes ALE1 to ALE4.

In accordance with an embodiment, the first insulating layer INS1 may not be disposed in an area for forming an open area OA as subsequent processes are performed. Accordingly, the first insulating layer INS1 may form a first opening 1200 having a first width 1220. In accordance with an embodiment, the first insulating layer INS1 may not be disposed in an area for forming a residual bank pattern RBNK as subsequent processes are performed. For example, after an insulating layer is formed, the first insulating layer INS1 in which the first opening 1200 is formed may be provided by removing a portion of the insulating layer, which is disposed in the area in which the open area OA is to be formed (or the area for forming the residual bank pattern RBNK.

Figure 13:
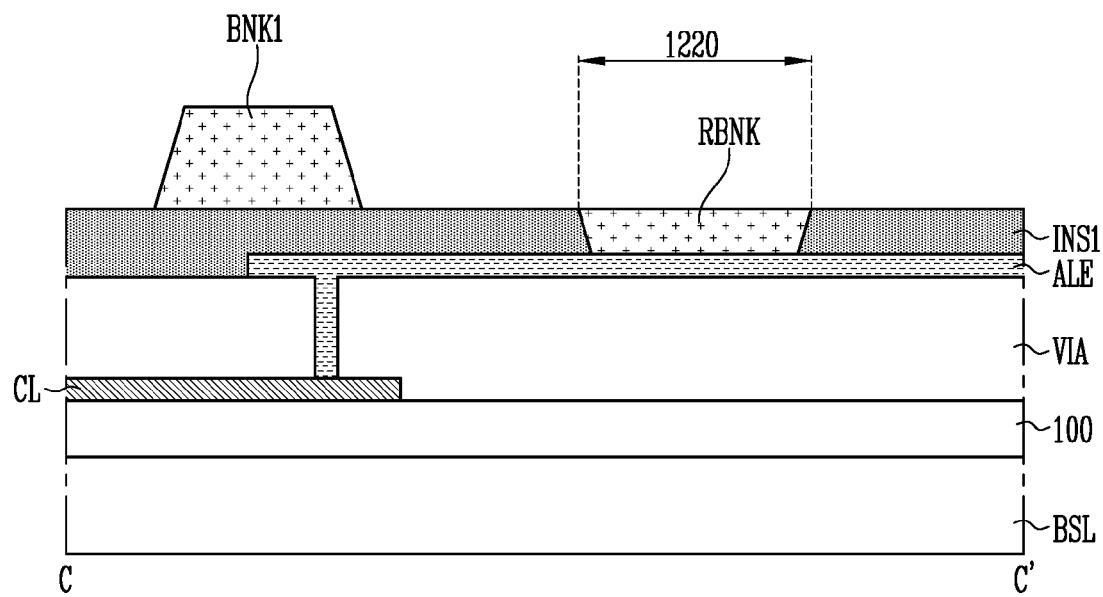
Figure 14:
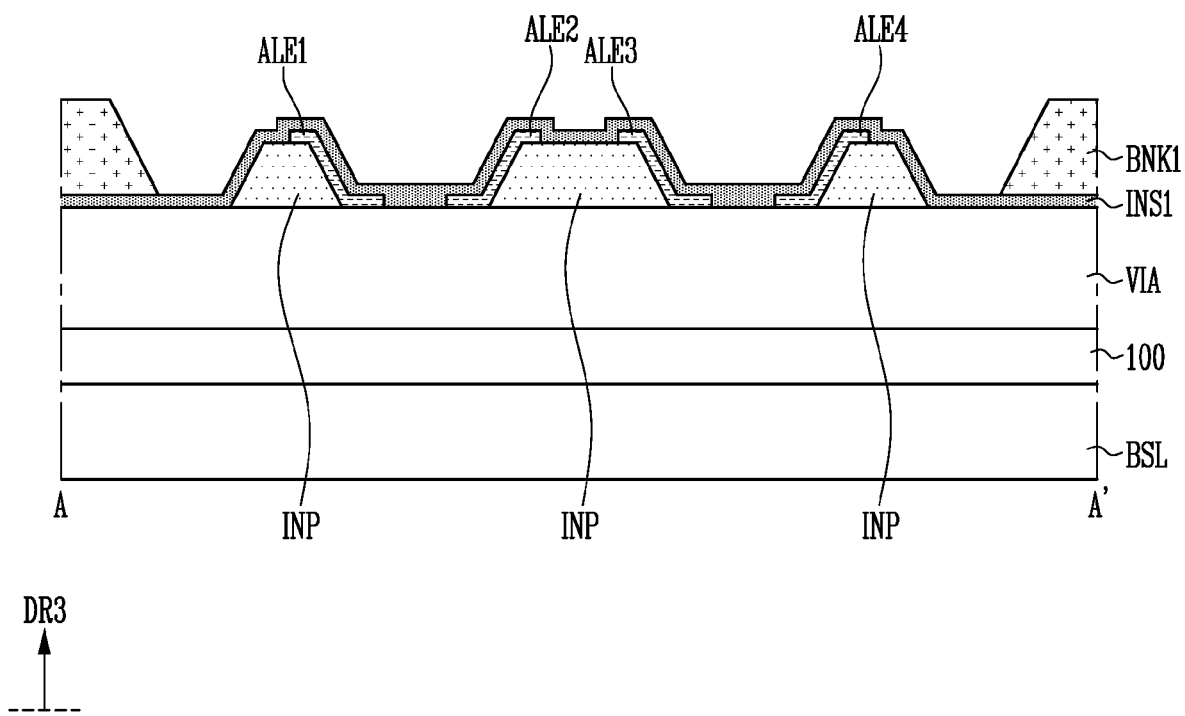

Referring to FIGS. 13 and 14, a first bank BNK1 may be disposed on the first insulating layer INS1. The residual bank pattern RBNK may be disposed in an area in which the first insulating layer INS1 is not disposed.

In this phase, in accordance with an embodiment, the first bank BNK1 and the residual bank pattern RBNK may be formed by forming a base bank layer on an entire surface, and patterning (or etching) the base bank layer, using a mask including a first area (e.g., a full-tone area) and a second area (e.g., a half-tone area).

In case that a process for patterning the base bank layer is performed, the full-tone area of the mask may overlap an area in which the first bank BNK1 is formed, and the half-tone area of the mask may overlap an area in which the residual bank pattern RBNK is formed. Accordingly, the first bank BNK1 protruding the thickness direction of the base layer BSL (e.g., the third direction DR3) may be provided, and the residual bank pattern RBNK filling at least a portion of the area in which the first insulating layer INS1 is not disposed may be provided.

For example, in accordance with an embodiment, the residual bank pattern RBNK may be formed (or patterned) through a same process as the first bank BNK1.

In accordance with an embodiment, the residual bank pattern RBNK may be patterned to correspond to a shape and a size of the first opening 1200 formed in the first insulating layer INS1. Accordingly, the residual bank pattern RBNK may be formed to have the first width 1220.

In this phase, the first bank BNK1 may have a shape surrounding at least a portion of an area in which the light emitting elements LD are disposed. For example, the first bank BNK1 may define a space in which a fluid may be accommodated. For example, in FIG. 15, the fluid may be accommodated between a bank BNK disposed one side and a bank BNK disposed at the other side.

In this phase, the formed residual bank pattern RBNK may contact the electrodes ALE. For example, before this phase is performed, some of the electrodes ALE, which are exposed by the first insulating layer INS1, may be covered by the residual bank pattern RBNK. The residual bank pattern RBNK may fill a groove formed by the first insulating layer INS1. In an embodiment, the area in which the residual bank pattern RBNK may correspond to an area for forming the open area OA as a subsequent process is performed.

Figure 15:
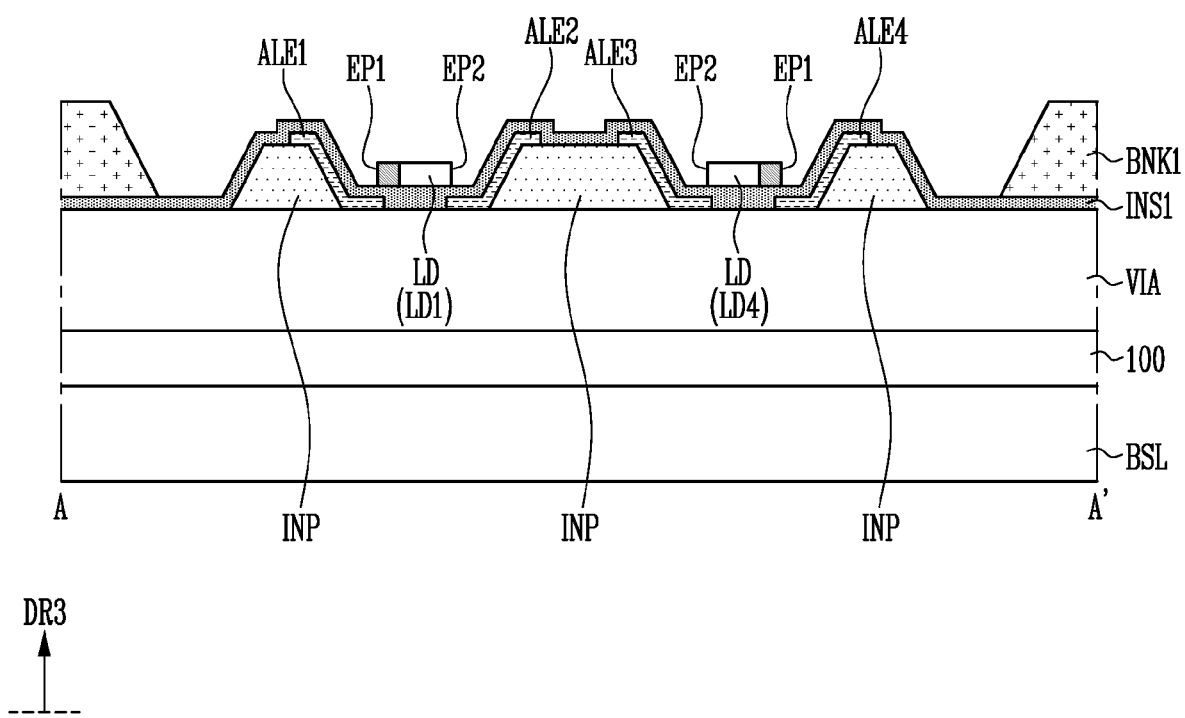

Referring to FIG. 15, the light emitting elements LD may be disposed on the first insulating layer INS1. For example, an ink including the light emitting elements LD may be supplied (or sprayed) onto the first insulating layer INS1, and an electrical signal may be applied to the electrodes ALE. The light emitting elements LD may be aligned (or disposed) on the electrodes ALE according to an electric field based on the electrical signal.

In accordance with an embodiment, the ink may be provided by a printing apparatus configured to spray a fluid. The ink may include a solvent and the light emitting elements LD. The light emitting element LD may be provided in plurality, to be dispersed and provided in the solvent having fluidity. For example, in an embodiment, the solvent may have fluidity, and accordingly, the light emitting elements LD may be dispersed in the solvent. The solvent may mean a liquid-phase material, instead of a solid-phase material, in which the light emitting elements LD are dispersed and provided. In an embodiment, the solvent may include an organic solvent. For example, the solvent may be one of Propylene Glycol Methyl Ether Acetate (PGMEA), Dipropylene Glycol n-Propyl Ether (DGPE), and triethylene Glycol n-Butyl Ether (TGBE). However, the disclosure is not limited to the above-described example, and the solvent may include various organic solvents.

In this phase, the ink may be accommodated in a space defined by the bank BNK. The light emitting elements LD included in the ink may be provided in a state in which the light emitting elements LD are randomly located in the space. Subsequently, an alignment signal may be provided to the electrodes ALE, so that an electric field may be formed on the electrodes ALE. For example, a first alignment signal may be supplied to the first electrode ALE1, and a second alignment signal may be supplied to the second electrode ALE2, so that an electric field may be formed between the first electrode ALE1 and the second electrode ALE2. The second alignment signal may be supplied to the third electrode ALE3, and the first alignment signal may be supplied to the fourth electrode ALE4, so that an electric field may be formed between the third electrode ALE3 and the fourth electrode ALE4. In an embodiment, the first alignment signal may be an AC signal, and the second alignment signal may be a ground signal. However, the disclosure is not limited to the above-described example. The AC signal may be any of a sine wave, a triangular wave, a square wave, a trapezoidal wave, and a pulse wave. However, the disclosure is not limited thereto, and the AC signal may have various AC signal forms by a process in the art.

In this phase, the light emitting elements LD may be moved (or rotated) by a force (e.g., a dielectrophoresis (DEP) force) according to the electric field, to be aligned (or disposed) on the first insulating layer INS1.

Figure 16:
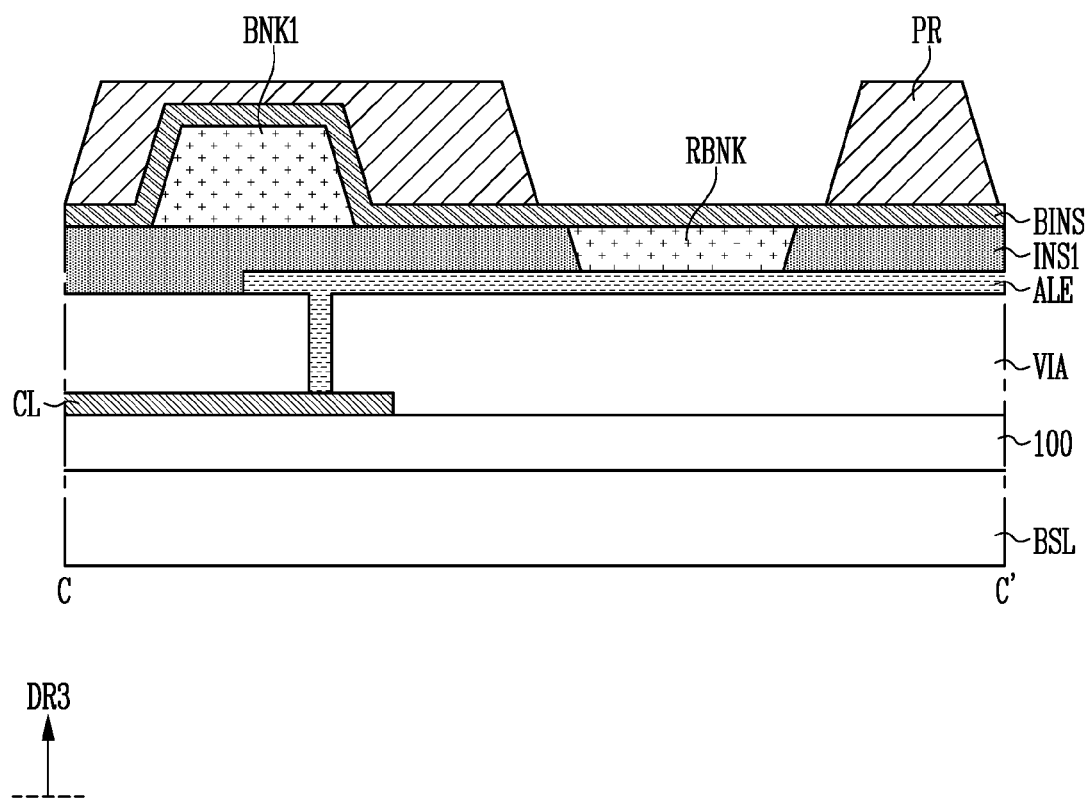
Figure 17:
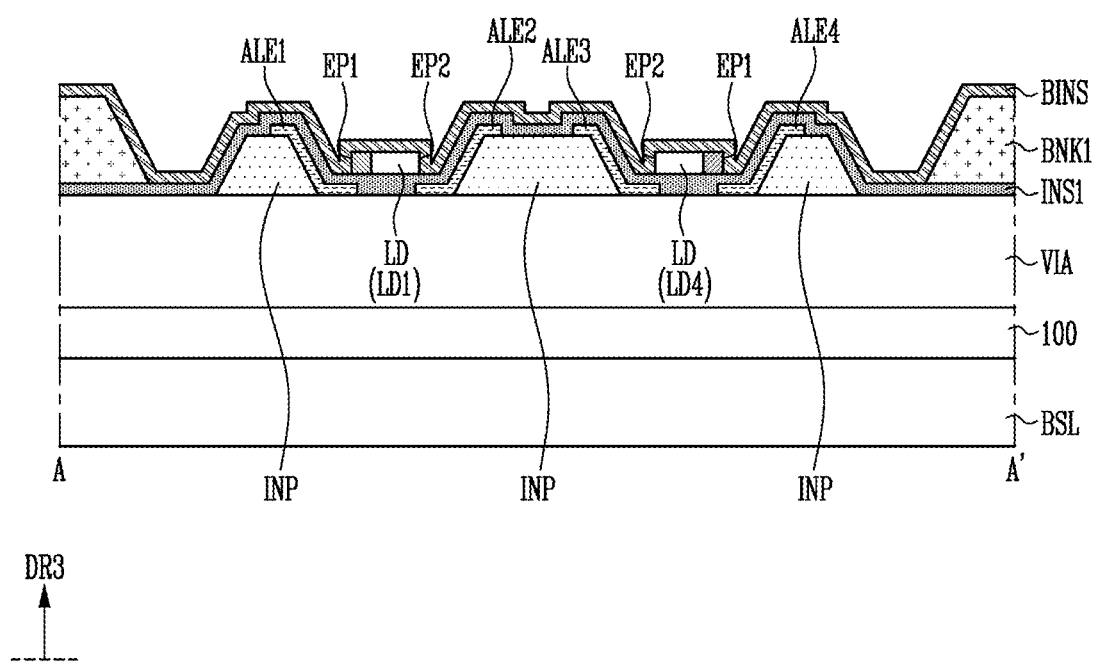

Referring to FIGS. 16 and 17, a base insulating layer BINS may be disposed on the first bank BNK1, the first insulating layer INS1, the residual bank pattern RBNK, and the light emitting elements LD. A photoresist layer PR for removing (or etching) a portion of the base insulating layer BINS may be formed. For convenience of descriptions, in FIG. 17, illustration of the photoresist layer PR is omitted.

In this phase, the base insulating layer BINS may be deposited on the entire surface, to cover at least the residual bank pattern RBNK and the light emitting elements LD. The photoresist layer PR may be patterned in a predetermined shape, to form an opening in an area in which the base insulating layer BINS is to be removed. The patterned photoresist layer PR may be used as an etching mask. For example, the patterned photoresist layer PR may be an etching mask for patterning a second insulating layer INS2. Further, the patterned photoresist layer PR may be an etching mask for forming the open area OA by patterning the electrode layers ALE. This will be described below with reference to FIG. 20.

In this phase, the base insulating layer BINS may contact the residual bank pattern RBNK and a portion of the first insulating layer INS1, which is adjacent to the residual bank pattern RBNK.

Figure 18:
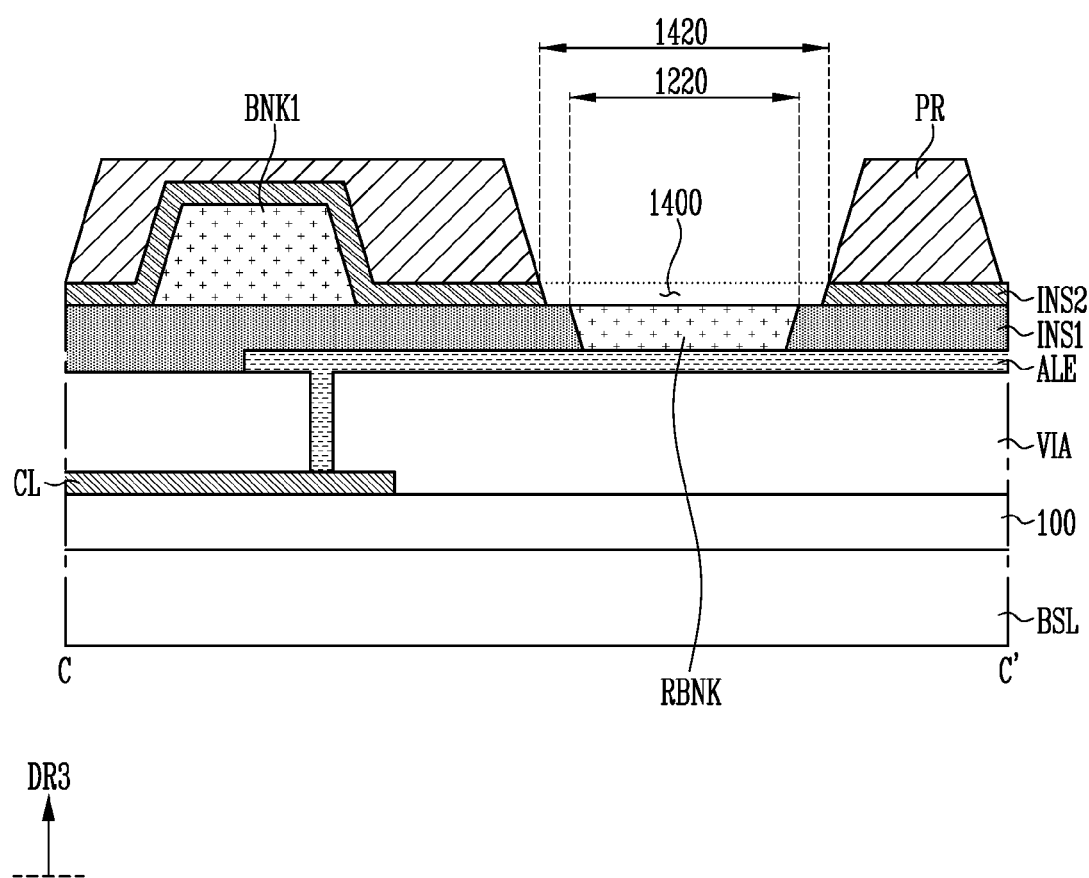
Figure 19:
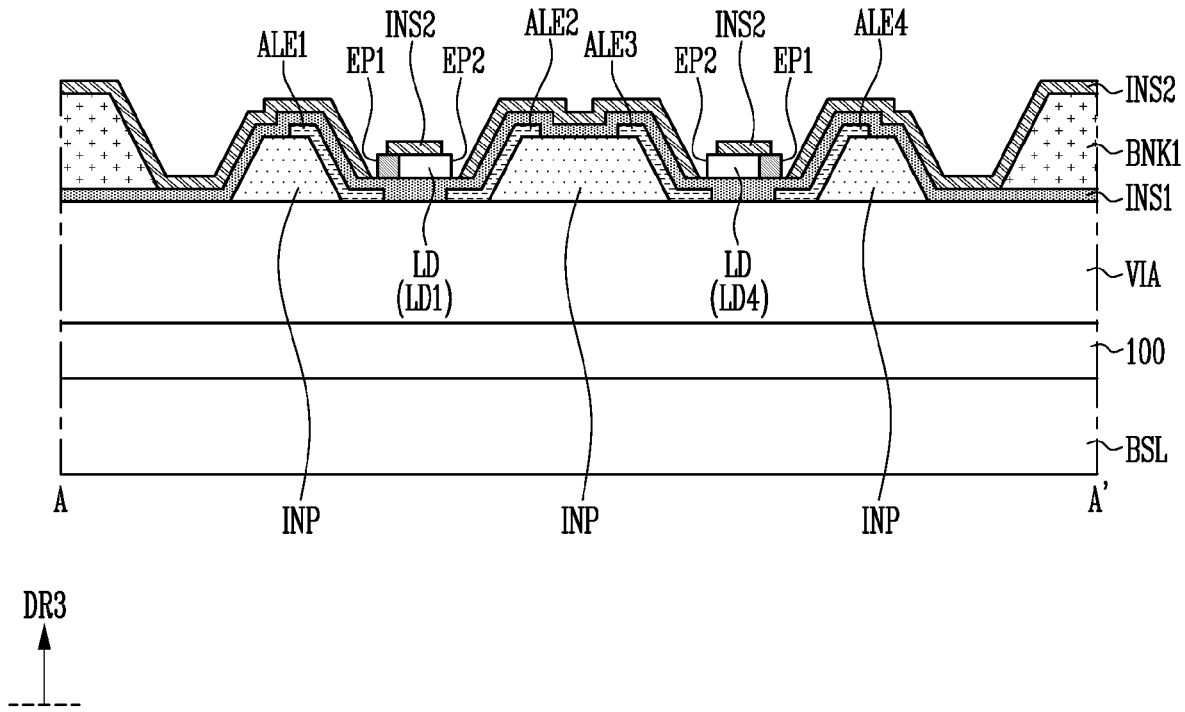

Referring to FIGS. 18 and 19, as at least a portion of the second insulating layer INS2 is removed (or etched), the residual bank pattern RBNK and a portion of the first insulating layer INS1 may be exposed, and at least a portion of each of the light emitting elements LD.

In this phase, a first end portion EP1 and a second end portion EP2 of the light emitting element LD may be exposed. At least a portion of the second insulating layer INS2 may remain on the light emitting element LD, to fix a position of the light emitting element LD, and overlap an active layer 12 of the light emitting element LD in a plan view, thereby reducing external influence on the light emitting element LD.

In this phase, the second insulating layer may be provided, to form a second opening 1400. The second opening 1400 may entirely cover or overlap the residual bank pattern RBNK in a plan view. For example, an area exposed by the second insulating layer INS1 may be greater than the area in which the residual bank pattern RBNK is disposed. For example, as described above, a second width 1420 of the second opening 1400 defined by the second insulating layer INS2 may be greater than the first width 1220 of the residual bank pattern RBNK. This is for the purpose of sufficiently removing the residual bank pattern RBNK in case that a process of removing (e.g., ashing) the residual bank pattern RBNK is performed as a subsequently performed process.

In accordance with an embodiment, the electrodes ALE may be covered by the residual bank pattern RBNK, and thus damage of the electrodes ALE in case that an etching process for forming the second insulating layer INS2 is performed may be substantially prevented.

Consequently, the first opening 1200 formed by the first insulating layer INS1 may be formed smaller than the second opening 1400 formed by the second insulating layer INS2, so that the residual bank pattern RBNK may be formed smaller than the second opening 1400. Accordingly, the residual bank pattern RBNK may be effectively removed in a subsequent process while substantially reducing influence on the electrodes ALE in case that the etching process for forming the second insulating layer INS2 is performed.

Figure 20:
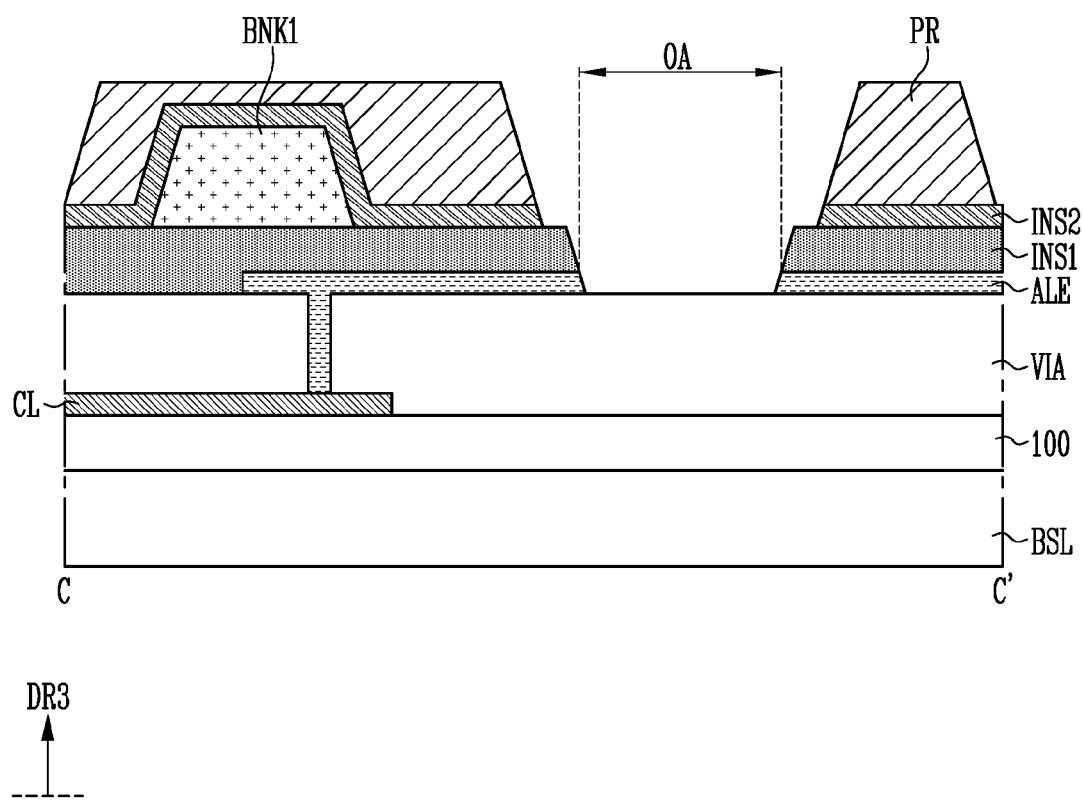

Referring to FIG. 20, the open area OA may be formed by removing (or etching) at least a portion of the electrodes ALE.

In this phase, the electrodes ALE may be etched through a wet etching process. However, the disclosure is not necessarily limited to the above-described example. In an embodiment, the electrodes ALE may be etched through a dry etching process.

In accordance with an embodiment, damage of adjacent components may be prevented even in case that the electrodes ALE are etched by using an etching mask (e.g., the patterned photoresist layer PR) for patterning the second insulating layer INS2. For example, in case that the electrodes ALE are etched, the second insulating layer INS2 may still have a state in which the second insulating layer INS2 is covered by the photoresist layer PR, and the electrodes ALE except an area to be etched may have a state in which the electrodes ALE are covered by the first insulating layer INS1 and the second insulating layer INS2.

Although not shown in any separate drawing, the photoresist layer PR may be removed after this phase is performed.

In accordance with an embodiment, the process of etching at least a portion of the electrodes ALE as a process for forming the open area OA may be performed based on the etching mask used to pattern the second insulating layer INS2. For example, the process of etching at least a portion of the electrodes ALE may be performed without further forming any separate etching mask after the residual bank pattern RBNK is ashed. Accordingly, the number of required masks may be reduced, so that process cost may be saved.

Figure 21:
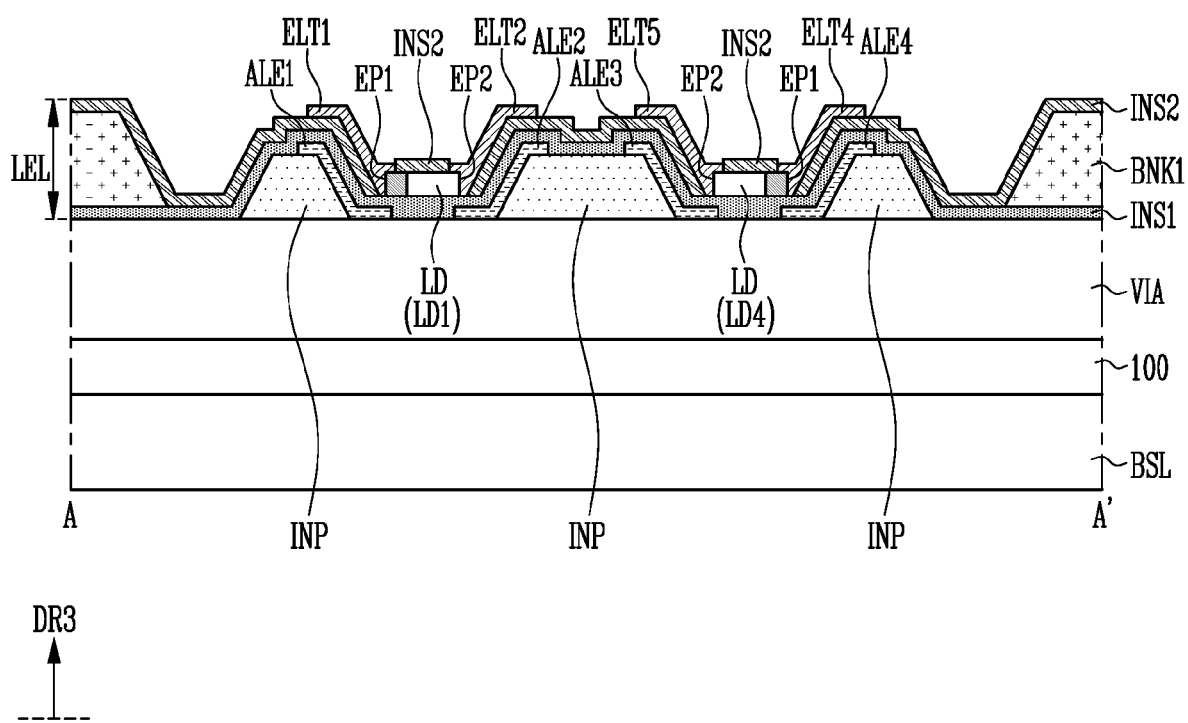

Referring to FIG. 21, the light emitting element LD and connection electrodes ELT may be electrically connected to each other by patterning the connection electrodes ELT.

In this phase, first to fifth connection electrodes ELT1 to ELT5 may be patterned, so that the light emitting elements LD may be configured to emit light.

Subsequently, although not shown in any separate drawing, a color conversion layer CCL, an optical layer OPL, and a color filter layer may be provided, thereby manufacturing the pixel in accordance with the embodiment of the disclosure.

In accordance with the disclosure, there may be provided a display device and a manufacturing method for a display device, in which the number of required masks is reduced, so that process cost may be saved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
pixels, wherein
each of the pixels includes:
   electrodes disposed on a base layer;
   a first insulating layer disposed on the electrodes;
   a light emitting element disposed on the first insulating layer;
   a bank disposed on the first insulating layer and protruding in a thickness direction of the base layer; and
   a second insulating layer, at least a portion of the second insulating layer being disposed on the first insulating layer,
at least part of the electrodes of a pixel among the pixels are spaced apart from at least part of the electrodes of another pixel among the pixels adjacent to the pixel with an open area being disposed between the electrodes,
the first insulating layer includes: a first opening overlapping the open area in a plan view,
the second insulating layer includes a second opening overlapping the open area in a plan view, and
the second opening entirely overlaps the first opening in a plan view.

2. The display device of claim 1, wherein the light emitting element is disposed in an area surrounded by the bank in a plan view.

3. The display device of claim 1, wherein
another portion of the second insulating layer is disposed on the bank, and
still another portion of the second insulating layer is disposed on the light emitting element.

4. The display device of claim 1, wherein the second opening exposes at least a portion of each of the first insulating layer and the electrodes.

5. The display device of claim 1, wherein the first opening overlaps top surfaces of the electrodes in a plan view, and exposes side surfaces of the electrodes.

6. The display device of claim 5, wherein the second opening entirely overlaps the first opening in a plan view.

7. The display device of claim 1, wherein
the first opening has a first width,
the second opening has a second width, and
the second width is greater than the first width.

8. The display device of claim 7, wherein
the open area has an open width, and
the second width is greater than the open width.

9. The display device of claim 8, wherein the first width is greater than the open width.

10. The display device of claim 1, wherein
each of the pixels further includes a first connection electrode supplying an anode signal for the light emitting element to emit light,
the electrodes include a first electrode electrically connected to the first connection electrode, and
the first electrode of one pixel among the pixels is spaced apart from the first electrode of another pixel among the pixels adjacent to the pixel with the open area being disposed between the electrodes.

11. The display device of claim 1, wherein
each of the pixels includes connection electrodes electrically connected to the light emitting element, the connection electrodes include a first connection electrode, a second connection electrode, a third connection electrode, a fourth connection electrode, and a fifth connection electrode, the light emitting element includes a first light emitting element, a second light emitting element, a third light emitting element, and a fourth light emitting element, and the first light emitting element is electrically connected between the first connection electrode and the second connection electrode, the second light emitting element is electrically connected between the second connection electrode and the third connection electrode, the third light emitting element is electrically connected between the third connection electrode and the fourth connection electrode, and the fourth light emitting element is electrically connected between the fourth connection electrode and the fifth connection electrode.

\* \* \* \* \*